(12) United States Patent
Zhang et al.

(10) Patent No.: US 11,088,213 B1
(45) Date of Patent: Aug. 10, 2021

(54) DISPLAY SUBSTRATE, DISPLAY APPARATUS, METHOD OF CONTROLLING DISPLAY SUBSTRATE, AND METHOD OF FABRICATING DISPLAY SUBSTRATE

(71) Applicants: BEIJING BOE DISPLAY TECHNOLOGY CO., LTD., Beijing (CN); BOE Technology Group Co., Ltd., Beijing (CN)

(72) Inventors: Chunbing Zhang, Beijing (CN); Shou Li, Beijing (CN); Zhanchang Bu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 63 days.

(21) Appl. No.: 16/632,221

(22) PCT Filed: Jul. 26, 2019

(86) PCT No.: PCT/CN2019/097903
§ 371 (c)(1),
(2) Date: Jan. 17, 2020

(87) PCT Pub. No.: WO2020/107917
PCT Pub. Date: Jun. 4, 2020

(30) Foreign Application Priority Data

Nov. 26, 2018 (CN) .......................... 201811420234.6

(51) Int. Cl.
*H01L 27/32* (2006.01)
*H01L 51/56* (2006.01)

(52) U.S. Cl.
CPC ...... *H01L 27/3218* (2013.01); *H01L 27/3232* (2013.01); *H01L 51/56* (2013.01)

(58) Field of Classification Search
None
See application file for complete search history.

(56) References Cited

U.S. PATENT DOCUMENTS

| | | |
|---|---|---|
| 2016/0254336 A1 | 9/2016 | Zhang et al. |
| 2016/0276616 A1 | 9/2016 | Zhan et al. |

(Continued)

FOREIGN PATENT DOCUMENTS

| | | |
|---|---|---|
| CN | 104297968 A | 1/2015 |
| CN | 104658437 A | 5/2015 |

(Continued)

OTHER PUBLICATIONS

Gao Hong-Yue, Yao Qiu-Xiang, Liu Pan, Zheng Zhi-Qiang, Liu Ji-Cheng, Zheng Hua-Dong, Zeng Chao, Yu Ying-Jie, Sun Tao, Zeng Zhen-Xiang. Latest development of display technologies. Chinese Physics B, 2016, 25(9): 094203 (Year: 2016).*

(Continued)

*Primary Examiner* — J. E. Schoenholtz
(74) *Attorney, Agent, or Firm* — Intellectual Valley Law, P.C.

(57) ABSTRACT

A display substrate is provided. The display substrate includes a first chromogenic layer; a plurality of first columns of light emitting elements on the first chromogenic layer; a second chromogenic layer on a side of the plurality of first columns of light emitting elements away from the first chromogenic layer; and a plurality of second columns of light emitting elements on a side of the second chromogenic layer away from the first chromogenic layer. The plurality of first columns of light emitting elements are arranged along substantially a same direction as the plurality of second columns of light emitting elements. The plurality of second columns of light emitting elements are spaced apart by a plurality of inter-column gap regions respectively. A respective one of the plurality of first columns of light emitting (Continued)

elements is at least partially in a respective one of the plurality of inter-column gap regions.

14 Claims, 11 Drawing Sheets

(56) References Cited

U.S. PATENT DOCUMENTS

2016/0329381 A1   11/2016  Xu et al.
2017/0092702 A1*  3/2017   Xu ..................... H04N 13/356

FOREIGN PATENT DOCUMENTS

| CN | 104765157 A | 7/2015 |
| CN | 105304677 A | 2/2016 |
| CN | 104155791 B | 1/2017 |

OTHER PUBLICATIONS

International Search Report & Written Opinion dated Oct. 31, 2019, regarding PCT/CN2019/097903.
First Office Action in the Chinese Patent Application No. 201811420234.6, dated Mar. 23, 2020; English translation attached.

* cited by examiner

```
┌─────────────────────────────────────────────────────────────────┐
│ Controlling both the plurality of first columns of light        │
│ emitting elements and the plurality of second columns of light  │
│ emitting elements to be in the turned-on state to emit light    │
└─────────────────────────────────────────────────────────────────┘
                                │
                                ▼
┌─────────────────────────────────────────────────────────────────┐
│ Controlling the second chromogenic layer to be in the light     │
│ transmitting state to allow light emitted from the plurality of │
│ first columns of light emitting elements along the first        │
│ direction to transmit through the second chromogenic layer and  │
│ the plurality of inter-column gap regions                       │
└─────────────────────────────────────────────────────────────────┘
                                │
                                ▼
┌─────────────────────────────────────────────────────────────────┐
│ Controlling the first chromogenic layer to be in a light        │
│ blocking state to block light emitted from the plurality of     │
│ first columns of light emitting elements along the second       │
│ direction from transmitting through the first chromogenic layer │
└─────────────────────────────────────────────────────────────────┘
```

FIG. 11

```
┌─────────────────────────────────────────────────────────────────┐
│ Controlling both the plurality of first columns of light        │
│ emitting elements and the plurality of second columns of light  │
│ emitting elements to be in the turned-on state to emit light    │
└─────────────────────────────────────────────────────────────────┘
                                │
                                ▼
┌─────────────────────────────────────────────────────────────────┐
│ Controlling the second chromogenic layer to be in the light     │
│ blocking state to block light emitted from the plurality of     │
│ first columns of light emitting elements along the first        │
│ direction from transmitting through the second chromogenic layer│
└─────────────────────────────────────────────────────────────────┘
                                │
                                ▼
┌─────────────────────────────────────────────────────────────────┐
│ Controlling the first chromogenic layer to be in the light      │
│ transmitting state to allow light emitted from the plurality of │
│ first columns of light emitting elements along the second       │
│ direction to transmit through the first chromogenic layer       │
└─────────────────────────────────────────────────────────────────┘
```

FIG. 12

DISPLAY SUBSTRATE, DISPLAY APPARATUS, METHOD OF CONTROLLING DISPLAY SUBSTRATE, AND METHOD OF FABRICATING DISPLAY SUBSTRATE

CROSS-REFERENCE TO RELATED APPLICATION

This application is a national stage application under 35 U.S.C. § 371 of International Application No. PCT/CN2019/097903, filed Jul. 26, 2019, which claims priority to Chinese Patent Application No. 201811420234.6, filed Nov. 26, 2018. Each of the forgoing applications is herein incorporated by reference in its entirety for all purposes.

TECHNICAL FIELD

The present invention relates to display technology, more particularly, to a display substrate, a display apparatus, a method of controlling a display substrate, and a method of fabricating a display substrate.

BACKGROUND

In present, the organic light emitting diode (OLED) display apparatus attracts more and more attention, because the OLED display apparatus has many advantages including self-illumination, rich colors, fast reaction speed, wide viewing angle, high contrast ratio, low power consumption, lightness and thinness, and good flexibility.

SUMMARY

In one aspect, the present invention provides a display substrate, comprising a first chromogenic layer; a plurality of first columns of light emitting elements on the first chromogenic layer; a second chromogenic layer on a side of the plurality of first columns of light emitting elements away from the first chromogenic layer; and a plurality of second columns of light emitting elements on a side of the second chromogenic layer away from the first chromogenic layer; wherein the plurality of first columns of light emitting elements are arranged along substantially a same direction as the plurality of second columns of light emitting elements; the plurality of second columns of light emitting elements are spaced apart by a plurality of inter-column gap regions respectively; and a respective one of the plurality of first columns of light emitting elements is at least partially in a respective one of the plurality of inter-column gap regions.

Optionally, an orthographic projection of a respective one the plurality of first columns of light emitting elements on the first chromogenic layer is at least partially non-overlapping with an orthographic projection of the plurality of second columns of light emitting elements on the first chromogenic layer; and an orthographic projection of a respective one the plurality of second columns of light emitting elements on the first chromogenic layer is at least partially non-overlapping with an orthographic projection of the plurality of first columns of light emitting elements on the first chromogenic layer.

Optionally, the second chromogenic layer occupies at least the plurality of inter-column gap regions.

Optionally, an orthographic projection of the first chromogenic layer on a base substrate substantially covers an orthographic projection of the plurality of first columns of light emitting elements on the base substrate; and an orthographic projection of the second chromogenic layer on the base substrate substantially covers an orthographic projection of the plurality of first columns of light emitting elements on the base substrate.

Optionally, the plurality of first columns of light emitting elements are a plurality of dual emitting light emitting elements and configured to emit light along a first direction from the plurality of first columns of light emitting elements to the second chromogenic layer and along a second direction from the plurality of first columns of light emitting elements to the first chromogenic layer; and the plurality of second columns of light emitting elements are a plurality of top emitting light emitting elements and configured to emit light along the first direction.

Optionally, when the display substrate is configured to be operated in a three-dimensional image display mode, the plurality of second columns of light emitting elements are turned off; the plurality of first columns of light emitting elements are turned on and configured to emit light; the second chromogenic layer is configured to be in a light transmitting state and configured to allow light emitted from the plurality of first columns of light emitting elements along the first direction to transmit through the second chromogenic layer and the plurality of inter-column gap regions; and the first chromogenic layer is configured to be in a light blocking state configured to block light emitted from the plurality of first columns of light emitting elements along the second direction from transmitting through the first chromogenic layer.

Optionally, when the display substrate is configured to be operated in a two-dimensional image display mode, the plurality of first columns of light emitting elements and the plurality of second columns of light emitting elements are both turned on and configured to emit light; the second chromogenic layer is configured to be in a light transmitting state configured to allow light emitted from the plurality of first columns of light emitting elements along the first direction to transmit through the second chromogenic layer and the plurality of inter-column gap regions; and the first chromogenic layer is configured to be in a light blocking state configured to block light emitted from the plurality of first columns of light emitting elements along the second direction from transmitting through the first chromogenic layer.

Optionally, when the display substrate is configured to be operated in a two-side display mode, the plurality of first columns of light emitting elements and the plurality of second columns of light emitting elements are both turned on and configured to emit light; the second chromogenic layer is configured to be in a light blocking state configured to block light emitted from the plurality of first columns of light emitting elements along the first direction from transmitting through the second chromogenic layer; and the first chromogenic layer is configured to be in a light transmitting state configured to allow light emitted from the plurality of first columns of light emitting elements along the second direction to transmit through the first chromogenic layer.

Optionally, at least one of the first chromogenic layer or the second chromogenic layer is an integral unitary layer extending substantially throughout the display substrate.

Optionally, the second chromogenic layer comprises a plurality of second chromogenic bars respectively in the plurality of inter-column gap regions; the first chromogenic layer comprises a plurality of first chromogenic bars; and an orthographic projection of a respective one of the plurality of first chromogenic bars on a base substrate substantially covers an orthographic projection of a respective one the plurality of first columns of light emitting elements on the base substrate.

Optionally, the display substrate further comprises a first controller configured to control the first chromogenic layer to reversibly transition between a light transmitting state and a light blocking state; and a second controller configured to control the second chromogenic layer to reversibly transition between the light transmitting state and the light blocking state.

Optionally, first chromogenic layer and the second chromogenic layer are two different photochromic layers selected from a group consisting of an infrared light photochromic layer and an ultraviolent light photochromic layer; the first controller is a first substantially transparent layer configured to control light transmitting state of the first chromogenic layer by transmitting infrared light or ultraviolent light to the first chromogenic layer; and the second controller is a second substantially transparent layer configured to control light transmitting state of the second chromogenic layer by transmitting infrared light or ultraviolent light to the second chromogenic layer.

Optionally, a respective one of the plurality of first columns of light emitting elements comprises a plurality of rows of first light emitting elements; a respective one of the plurality of rows of first light emitting elements comprises a plurality of first subpixels; a respective one of the plurality of second columns of light emitting elements comprises a plurality of rows of second light emitting elements; and a respective one of the plurality of rows of second light emitting elements comprises a plurality of second subpixels.

In another aspect, the present invention provides a display apparatus, comprising the display substrate described herein or fabricated by a method described herein; and one or more integrated circuits connected to the display substrate.

Optionally, the display apparatus further comprises an infrared light source and an ultraviolent light source respectively connected with the first chromogenic layer and the second chromogenic layer.

In another aspect, the present invention provides a method of controlling a display substrate; wherein the display substrate comprises a first chromogenic layer; a plurality of first columns of light emitting elements on the first chromogenic layer; a second chromogenic layer on a side of the plurality of first columns of light emitting elements away from the first chromogenic layer; and a plurality of second columns of light emitting elements on a side of the second chromogenic layer away from the first chromogenic layer; wherein the plurality of first columns of light emitting elements are arranged substantially along a same direction as the plurality of second columns of light emitting elements; the plurality of second columns of light emitting elements are spaced apart by a plurality of inter-column gap regions respectively; and a respective one of the plurality of first columns of light emitting elements is at least partially in a respective one of the plurality of inter-column gap regions; wherein the method comprises controlling the plurality of first columns of light emitting elements to reversibly transition between a turned-on state and a turned-off state; controlling the plurality of second columns of light emitting elements to reversibly transition between the turned-on state and the turned-off state; controlling the first chromogenic layer to reversibly transition between a light transmitting state and a light blocking state; and controlling the second chromogenic layer to reversibly transition between a light transmitting state and a light blocking state.

Optionally, the method further comprises operating the display substrate in a three-dimensional image display mode; wherein operating the display substrate in the three-dimensional image display mode comprises controlling the plurality of second columns of light emitting elements to be in the turned-off state; controlling the plurality of first columns of light emitting elements to be in the turned-on state to emit light; controlling the second chromogenic layer to be in the light transmitting state to allow light emitted from the plurality of first columns of light emitting elements along the first direction to transmit through the second chromogenic layer and the plurality of inter-column gap regions; and controlling the first chromogenic layer to be in the light blocking state to block light emitted from the plurality of first columns of light emitting elements along the second direction from transmitting through the first chromogenic layer.

Optionally, the method further comprises operating the display substrate in a two-dimensional image display mode; wherein operating the display substrate in a two-dimensional image display mode comprises controlling both the plurality of first columns of light emitting elements and the plurality of second columns of light emitting elements to be in the turned-on state to emit light; controlling the second chromogenic layer to be in the light transmitting state to allow light emitted from the plurality of first columns of light emitting elements along the first direction to transmit through the second chromogenic layer and the plurality of inter-column gap regions; and controlling the first chromogenic layer to be in a light blocking state to block light emitted from the plurality of first columns of light emitting elements along the second direction from transmitting through the first chromogenic layer.

Optionally, the method further comprises operating the display substrate in a two-side display mode; wherein operating the display substrate in the two-side display mode comprises controlling both the plurality of first columns of light emitting elements and the plurality of second columns of light emitting elements to be in the turned-on state to emit light; controlling the second chromogenic layer to be in the light blocking state to block light emitted from the plurality of first columns of light emitting elements along the first direction from transmitting through the second chromogenic layer; and controlling the first chromogenic layer to be in the light transmitting state to allow light emitted from the plurality of first columns of light emitting elements along the second direction to transmit through the first chromogenic layer.

In another aspect, the present invention provides a method of fabricating a display substrate, comprising forming a first chromogenic layer; forming a plurality of first columns of light emitting elements on the first chromogenic layer; forming a second chromogenic layer on a side of the plurality of first columns of light emitting elements away from the first chromogenic layer; and forming a plurality of second columns of light emitting elements on a side of the second chromogenic layer away from the first chromogenic layer; wherein the plurality of first columns of light emitting elements are arranged substantially along a same direction as the plurality of second columns of light emitting elements; the plurality of second columns of light emitting elements are spaced apart by a plurality of inter-column gap regions respectively; and a respective one of the plurality of first columns of light emitting elements is at least partially in a respective one of the plurality of inter-column gap regions.

BRIEF DESCRIPTION OF THE FIGURES

The following drawings are merely examples for illustrative purposes according to various disclosed embodiments and are not intended to limit the scope of the present invention.

FIG. 11 is a flow chart illustrating a method of operating the display substrate in a two-dimensional image display mode in some embodiments according to the present disclosure.

FIG. 12 is a flow chart illustrating a method of operating the display substrate in a two-side display mode in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Usually, the display panel of an OLED display apparatus includes a light emitting layer only emit light in one direction, which cannot perform multiple display tasks including three-dimensional display and two-side display.

Accordingly, the present disclosure provides, inter alia, a display substrate, a display apparatus, a method of controlling a display substrate and a method of fabricating a display substrate that substantially obviate one or more of the problems due to limitations and disadvantages of the related art. In one aspect, the present disclosure provides a display substrate. In some embodiments, the display substrate includes a first chromogenic layer; a plurality of first columns of light emitting elements on the first chromogenic layer; a second chromogenic layer on a side of the plurality of first columns of light emitting elements away from the first chromogenic layer; and a plurality of second columns of light emitting elements on a side of the second chromogenic layer away from the first chromogenic layer. Optionally, the plurality of first columns of light emitting elements are arranged substantially along a same direction as the plurality of second columns of light emitting elements. Optionally, the plurality of second columns of light emitting elements are spaced apart by a plurality of inter-column gap regions respectively. Optionally, a respective one of the plurality of first columns of light emitting elements is at least partially in a respective one of the plurality of inter-column gap regions.

Figure 1:
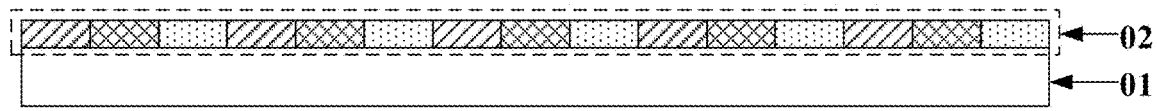
FIG. 1 is a schematic diagram of a conventional display substrate according to the present disclosure.

FIG. 1 is a schematic diagram of a conventional display substrate according to the present disclosure. Referring to FIG. 1, a conventional display substrate includes a base substrate 01, and a one-sided light emitting layer 02 on the base substrate 01. It is disclosed by the present disclosure that the one-sided light emitting layer 02 cannot perform multiple display tasks including three-dimensional display and two-side display.

Figure 2A:
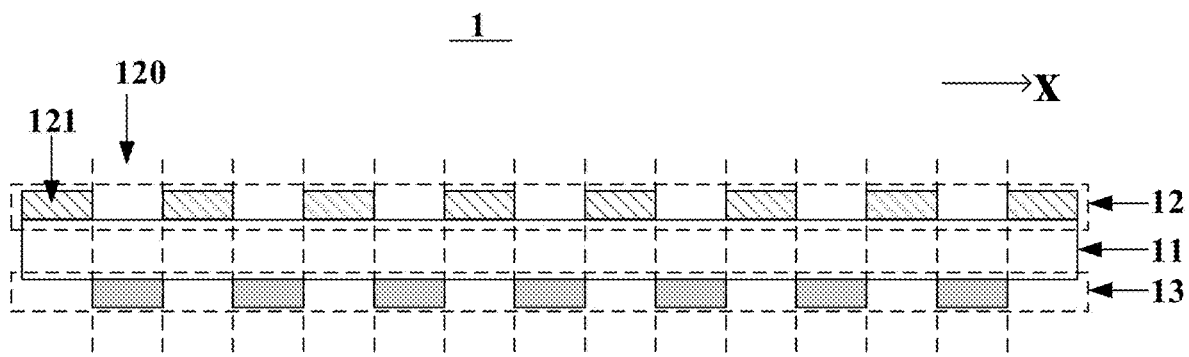
FIG. 2A is a schematic diagram of a structure of a display substrate in some embodiments according to the present disclosure.

FIG. 2A is a schematic diagram of a structure of a display substrate in some embodiments according to the present disclosure. Referring to FIG. 2A, in some embodiments, the display substrate 1 disclosed in the present disclosure includes a base substrate 11, a plurality of first columns of light emitting elements 13 on the base substrate 11, and a plurality of second columns of light emitting elements 12 on a side of the base substrate 11 away from the plurality of first columns of light emitting elements 13. Optionally, the plurality of first columns of light emitting elements 13 are arranged substantially along a same direction X (e.g., the arrangement direction X) as the plurality of second columns of light emitting elements 12.

As used herein, the term "arranged substantially along a same direction" refers to a first arrangement direction of the plurality of first columns of light emitting elements and a second arrangement direction of the plurality of second columns of light emitting elements forming a dihedral angle between them, and the dihedral angle is in a range of 0 degree to approximately 15 degrees, e.g., 0 degree, 0 degree to approximately 1 degree, approximately 1 degree to approximately 2 degrees, approximately 2 degree to approximately 5 degrees, approximately 5 degree to approximately 10 degrees, and approximately 10 degree to approximately 15 degrees. For example, the plurality of first columns of light emitting elements 13 are arranged along a first arrangement direction X1, the plurality of second columns of light emitting elements 12 are arranged along a second arrangement direction X2. a dihedral angle between the first arrangement direction X1 and the second arrangement direction X2 is 0 degree, and the dihedral angle between the first arrangement direction X1, the second arrangement direction X2, and the arrangement direction X is also 0 degree.

Figure 2B:
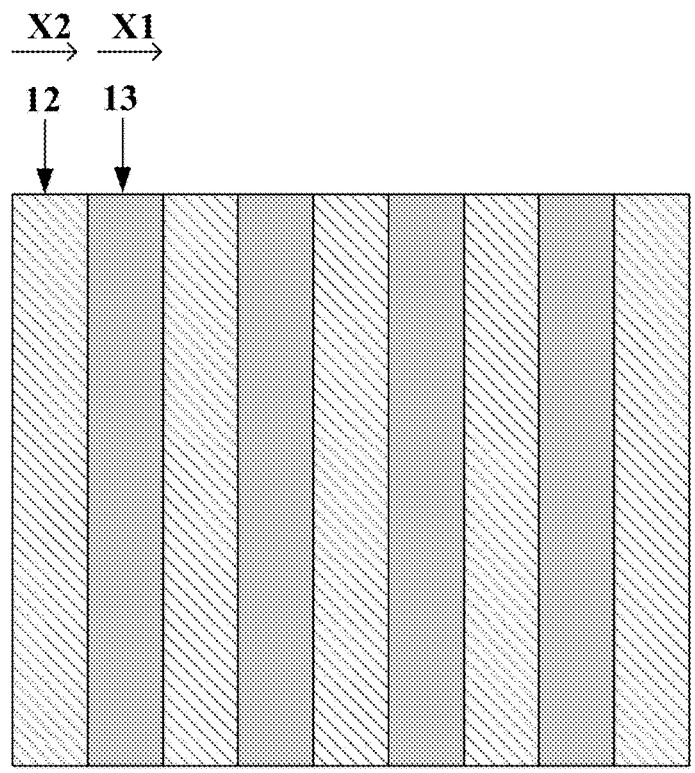
FIG. 2B is a plan view of a structure of a display substrate in some embodiments according to the present disclosure.

FIG. 2B is a plan view of a structure of a display substrate in some embodiments according to the present disclosure. Referring to FIG. 2A and FIG. 2B, in some embodiments, the plurality of second columns of light emitting elements 12 are spaced apart by a plurality of inter-column gap regions 120 respectively. Optionally, a respective one of the plurality of first columns of light emitting elements 13 is at least partially in a respective one of the plurality of inter-column gap regions 120. Optionally, the respective one of the plurality of first columns of light emitting elements 13 is substantially in the respective one of the plurality of inter-column gap regions 120.

Figure 2C:
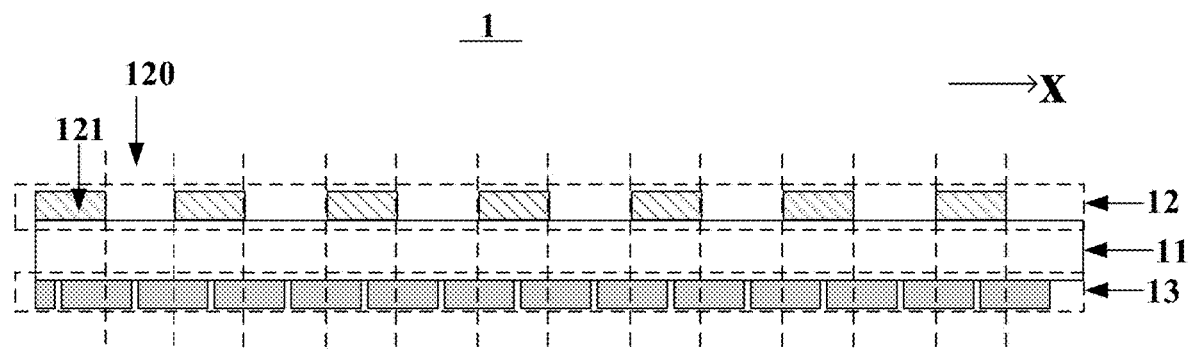
FIG. 2C is a schematic diagram of a structure of a display substrate in some embodiments according to the present disclosure.
Figure 2D:
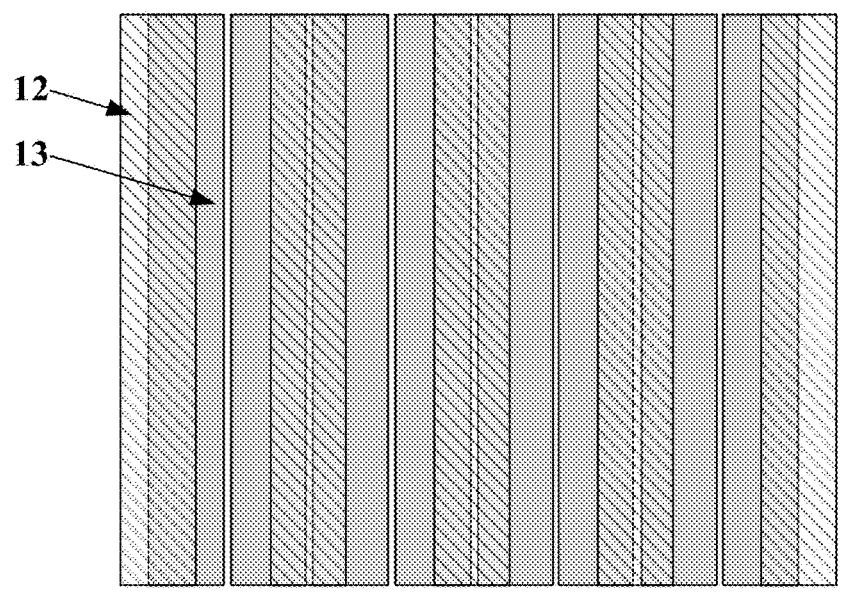
FIG. 2D is a plan view of a structure of a display substrate in some embodiments according to the present disclosure.

FIG. 2C is a schematic diagram of a structure of a display substrate in some embodiments according to the present disclosure. FIG. 2D is a plan view of a structure of a display substrate in some embodiments according to the present disclosure. Referring to FIG. 2C and FIG. 2D, optionally, the respective one of the plurality of first columns of light emitting elements 13 is partially in the respective one of the plurality of inter-column gap regions 120.

In some embodiments, referring to FIG. 2A to FIG. 2D, an orthographic projection of a respective one the plurality of first columns of light emitting elements 13 on the base substrate 11 is at least partially non-overlapping with an orthographic projection of the plurality of second columns of light emitting elements 12 on the base substrate 11. An orthographic projection of a respective one the plurality of second columns of light emitting elements 12 on the base substrate 11 is at least partially non-overlapping with an orthographic projection of the plurality of first columns of light emitting elements 13 on the base substrate 11.

Figure 2E:
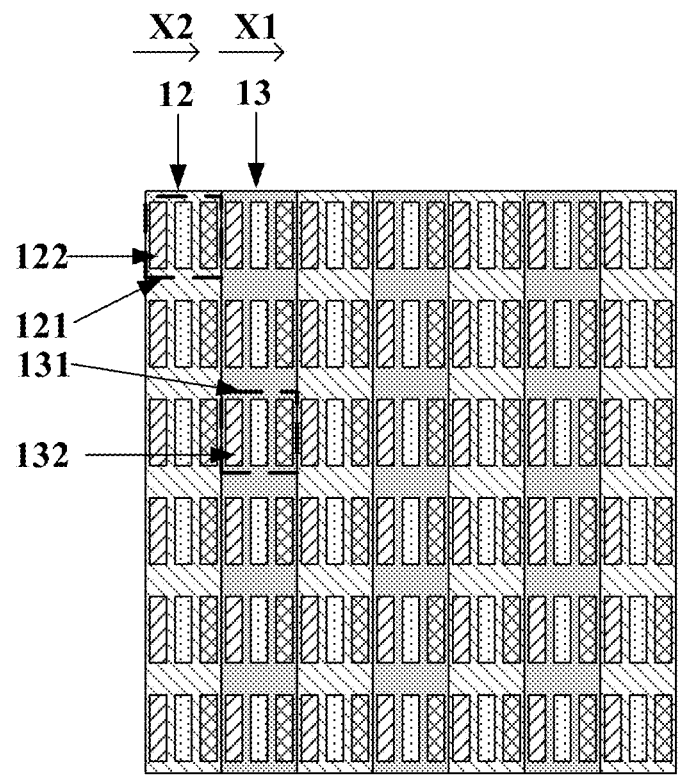
FIG. 2E is a plan view of a structure of a display substrate in some embodiments according to the present disclosure.

FIG. 2E is a plan view of a structure of a display substrate in some embodiments according to the present disclosure. Referring to FIG. 2E, in some embodiments, a respective one of the plurality of first columns of light emitting elements 13 includes a plurality of rows of first light emitting elements 131. A respective one of the plurality of rows of first light emitting elements 131 includes a plurality of first subpixels 132, e.g. three first subpixels. In some embodiments, a respective one of the plurality of second columns of light emitting elements 12 includes a plurality of rows of second light emitting elements 121. A respective one of the plurality of rows of second light emitting elements 121 includes a plurality of second subpixels 122, e.g., three second subpixels.

Figure 2F:
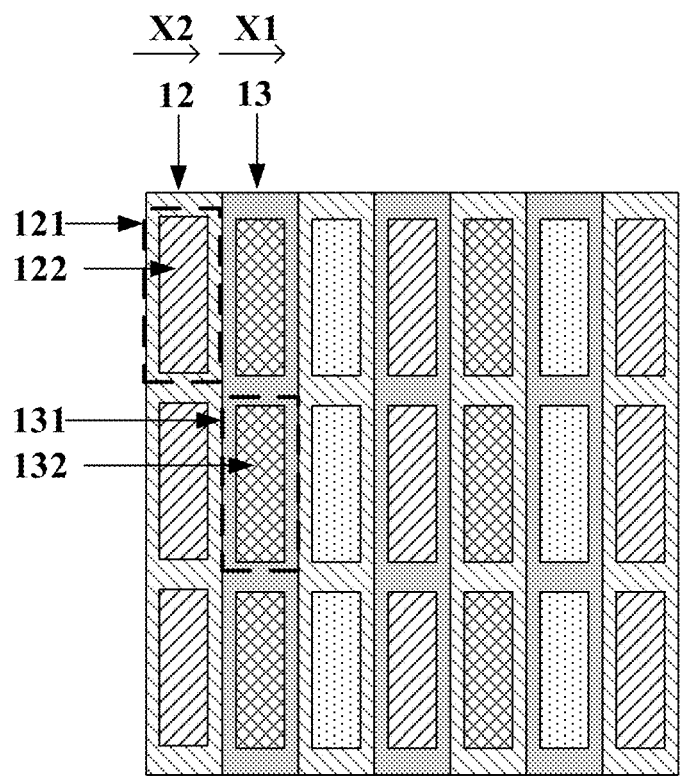
FIG. 2F is a plan view of a structure of a display substrate in some embodiments according to the present disclosure.

FIG. 2F is a plan view of a structure of a display substrate in some embodiments according to the present disclosure. Referring to FIG. 2F, in some embodiments, the respective one of the plurality of first columns of light emitting elements 13 includes the plurality of rows of first light emitting elements 131. The respective one of the plurality of rows of first light emitting elements 131 includes a single first subpixel of the plurality of first subpixels 132. In some embodiments, the respective one of the plurality of second columns of light emitting elements 12 includes the plurality of rows of second light emitting elements 121. The respective one of the plurality of rows of second light emitting elements 121 includes the single second subpixel of the plurality of second subpixels 122.

Figure 2G:
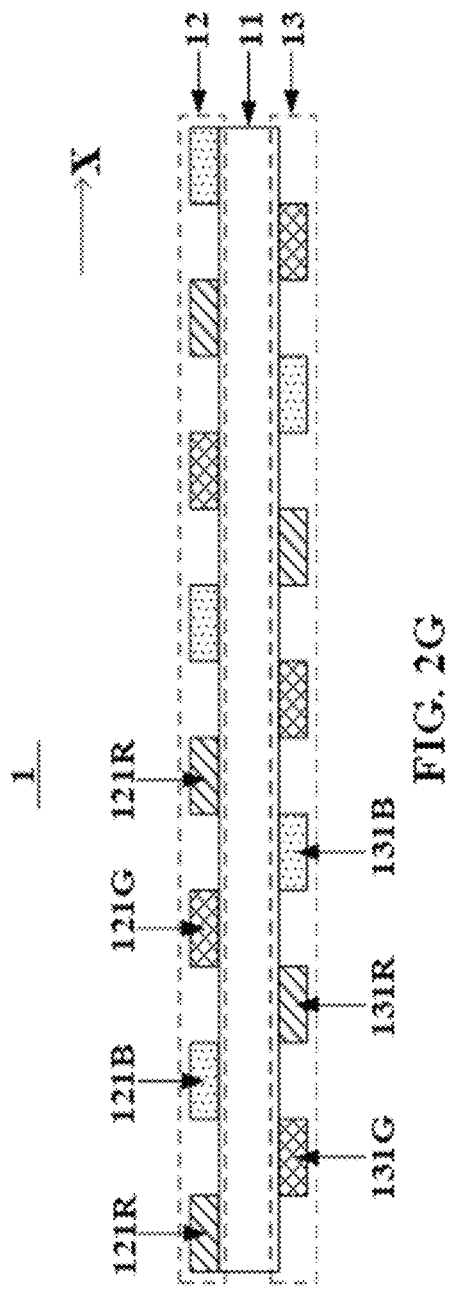
FIG. 2G is a schematic diagram of a structure of a display substrate in some embodiments according to the present disclosure.

FIG. 2G is a schematic diagram of a structure of a display substrate in some embodiments according to the present disclosure. Referring to FIG. 2F and FIG. 2G, in some embodiments, a respective one of the plurality of first subpixels 132 is selected from a groups consisting a subpixel in red color, a subpixel in blue color, and a subpixel in green color. A respective one of the plurality of second subpixels 122 is selected from the groups consisting a red subpixel, a subpixel in blue color, and a subpixel in green color. For example, the plurality of first columns of light emitting elements 13 includes a first subpixel in red color 131R, a first subpixel in blue color 131B, and a first subpixel in green color 131G. The plurality of second columns of light emitting elements 12 includes a second subpixel in red color 121R, a second subpixel in blue color 121B, and a second subpixel in green color 121G.

Optionally, referring to FIG. 2F, an orthographic projection of the first subpixel in green color 131G on the plurality of second columns of light emitting elements 12 at least partially in an inter-column gap region between the second subpixel in red color 121R and a second subpixel in blue color 121B. An orthographic projection of the first subpixel in red color 131R on the plurality of second columns of light emitting elements 12 at least partially in an inter-column gat region between the second subpixel in blue color 121B and a second subpixel in green color 121G. An orthographic projection of the first subpixel in blue color 131B on the plurality of second columns of light emitting elements 12 at least partially in an inter-column gap region between the second subpixel in green color 121G and the second subpixel in red color 121R.

Figure 3:
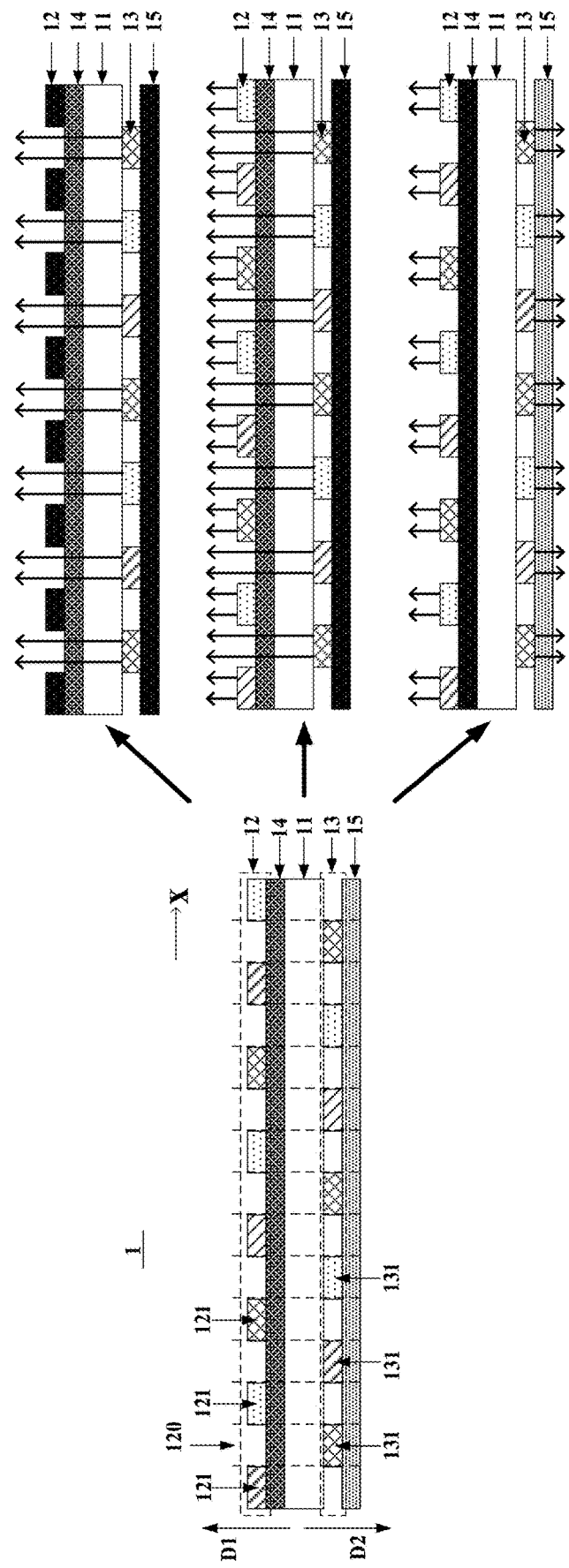
FIG. 3 is a schematic diagram of a structure of a display substrate and three different displaying modes of the display substrate in some embodiments according to the present disclosure.

FIG. 3 is a schematic diagram of a structure of a display substrate and three different displaying modes of the display substrate in some embodiments according to the present disclosure. A left figure of FIG. 3 is a schematic diagram of a structure of a display substrate. Referring to the left figure of FIG. 3, in some embodiments, the display apparatus includes the first chromogenic layer 15; the plurality of first columns of light emitting elements 13 on the first chromogenic layer 15; the second chromogenic layer 14 on a side of the plurality of first columns of light emitting elements 13 away from the first chromogenic layer 15; and the plurality of second columns of light emitting elements 12 on a side of the second chromogenic layer 14 away from the first chromogenic layer 15.

For example, referring to FIG. 3, an orthographic projection of the respective one the plurality of first columns of light emitting elements 13 on the first chromogenic layer 15 is at least partially non-overlapping with an orthographic projection of the plurality of second columns of light emitting elements 12 on the first chromogenic layer 15. An orthographic projection of the respective one the plurality of second columns of light emitting elements 12 on the first chromogenic layer 15 is at least partially non-overlapping with an orthographic projection of the plurality of first columns of light emitting elements 13 on the first chromogenic layer 15.

Optionally, both the first chromogenic layer 15 and the second chromogenic layer 14 has a light transmitting state and a light blocking state. For example, in the light transmitting state, the first chromogenic layer 15 and the second chromogenic layer 14 are substantially transparent. In the light block state, the first chromogenic layer 15 and the second chromogenic layer are substantially non-transparent. Optionally, the first chromogenic layer 15 can be controlled to reversibly transition between the light transmitting state and the light blocking state. Optionally, the second chromogenic layer 14 can be controlled to reversibly transition between the light transmitting state and the light blocking state.

As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

As used herein, the term "substantially non-transparent" means less than 50 percent (e.g., less than 50 percent, less than 40 percent, less than 30 percent, less than 20 percent, less than 10 percent, zero percent) of an incident light in the visible wavelength range transmitted therethrough.

In some embodiments, the plurality of first columns of light emitting elements 13 are a plurality of dual emitting light emitting elements and configured to emit light along a first direction D1 from the plurality of first columns of light emitting elements 13 to the second chromogenic layer 14 and along a second direction D2 from the plurality of first columns of light emitting elements 13 to the first chromogenic layer 15. The plurality of second columns of light emitting elements 12 are a plurality of top emitting light emitting elements and configured to emit light along the first direction D1. For example, the light emitted from the plurality of second columns of light emitting elements 12 is emitted from a side of the plurality of second columns of light emitting elements 12 away from the plurality of first columns of light emitting elements 13.

A right top figure of FIG. 3 is a schematic diagram illustrating a three-dimensional image display mode in some embodiments according to the present disclosure. In some embodiments, referring to the right top figure of FIG. 3, when the display substrate 1 is configured to be operated in a three-dimensional image display mode, the plurality of second columns of light emitting elements 12 are turned off, and the plurality of first columns of light emitting elements 13 are turned on and configured to emit light. The second chromogenic layer 14 is configured to be in the light transmitting state and configured to allow light emitted from the plurality of first columns of light emitting elements 13 along the first direction D1 to transmit through the second chromogenic layer 14 and the plurality of inter-column gap regions 120; and the first chromogenic layer 15 is configured to be in the light blocking state configured to block light emitted from the plurality of first columns of light emitting elements 13 along the second direction D2 from transmitting through the first chromogenic layer 15.

A right middle figure of FIG. 3 is a schematic diagram illustrating a two-dimensional image display mode in some embodiments according to the present disclosure. In some embodiments, referring to the right middle figure of FIG. 3, when the display substrate 1 is configured to be operated in a two-dimensional image display mode, the plurality of first columns of light emitting elements 13 and the plurality of second columns of light emitting elements 12 are both turned on and configured to emit light. The second chromogenic layer 14 is configured to be in the light transmitting state configured to allow light emitted from the plurality of first columns of light emitting elements 13 along the first direction D1 to transmit through the second chromogenic layer 14 and the plurality of inter-column gap regions 120. The first chromogenic layer 15 is configured to be in the light blocking state configured to block light emitted from the plurality of first columns of light emitting elements 13 along the second direction D2 from transmitting through the first chromogenic layer 15.

A right bottom figure of FIG. 3 is a schematic diagram illustrating a two-side display mode in some embodiments according to the present disclosure. In some embodiments, referring to the right bottom figure of FIG. 3, when the display substrate 1 is configured to be operated in a two-side display mode, the plurality of first columns of light emitting elements 13 and the plurality of second columns of light emitting elements 12 are both turned on and configured to emit light. The second chromogenic layer 14 is configured to be in the light blocking state configured to block light emitted from the plurality of first columns of light emitting elements 13 along the first direction D1 from transmitting through the second chromogenic layer 14. The first chromogenic layer 15 is configured to be in the light transmitting state configured to allow light emitted from the plurality of first columns of light emitting elements 13 along the second direction D2 to transmit through the first chromogenic layer 15.

In some embodiments, both the plurality of first columns of light emitting elements 13 and the plurality of second columns of light emitting elements 12 are a plurality of single sided emitting light emitting elements.

Optionally, light emitted from the plurality of second columns of light emitting elements 12 has a light emitting direction along the first direction D1. Light emitted from the plurality of first columns of light emitting elements 13 has a light emitting direction along the first direction D1. When the display substrate 1 is configured to be operated in the two-dimensional image display mode, the plurality of first columns of light emitting elements 13 and the plurality of second columns of light emitting elements 12 are both turned on and configured to emit light along the first direction D1. When the display substrate 1 is configured to be operated in the three-dimensional image display mode, the plurality of second columns of light emitting elements 12 are turned off, and the plurality of first columns of light emitting elements 13 are turned on and configured to emit light along the first direction D1.

Optionally, light emitted from the plurality of second columns of light emitting elements 12 has the light emitting direction along the second direction D1. Light emitted from the plurality of first columns of light emitting elements 13 has the light emitting direction along the second direction D2. When the display substrate 1 is configured to be operated in the two-side display mode, the plurality of first columns of light emitting elements 13 and the plurality of second columns of light emitting elements 12 are both turned on and configured to emit light.

In some embodiments, referring to FIG. 3, the plurality of second columns of light emitting elements 12 and the plurality of first columns of light emitting elements 13 are on two opposing side of the base substrate 11. Optionally, the second chromogenic layer 14 is between the base substrate 11 and the plurality of second columns of light emitting elements 12, so a first display surface of the plurality of second columns of light emitting elements 12 is a side of the plurality of second columns of light emitting elements 12 away from the base substrate 11, a second display surface of the plurality of first columns of light emitting elements 13 is a side of the plurality of first columns of light emitting elements 13 away from the base substrate 11.

Optionally, the plurality of second columns of light emitting elements 12 and the plurality of first columns of light emitting elements 13 are on a same side of the base substrate 11. Optionally, the second chromogenic layer 14 is between the base substrate 11 and the plurality of first columns of light emitting elements 13. As long as the light emitted from the plurality of first columns of light emitting elements 13 can transmit through the plurality of inter-column gap regions 120, and the second chromogenic layer 14 in the light blocking state can block light emitted from the plurality of first columns of light emitting elements 13 from transmitting through the plurality of inter-column gap regions 120.

In some embodiments, the second chromogenic layer 14 occupies at least the plurality of inter-column gap regions 120. As used herein, the term "occupy" in the context of the present disclosure refers to a layer extends across a gap region. For example, the second chromogenic layer 14 occupies at least the plurality of inter-column gap regions 120 by extending across the plurality of inter-column gap regions 120 along a plane that intersect the plurality of inter-column gap regions 120. Optionally, when a layer occupies a gap region along a plane intersecting the gap region, the layer is present in substantially all of an intersecting area between the plane and the gap region. For example, when the second chromogenic layer 14 occupies at least the plurality of inter-column gap regions 120, the second chromogenic layer 14 is present in substantially all of a plurality of intersecting areas between the plane and the plurality of inter-column gap regions 120. As used herein, the term "substantially all" refers to at least 90%, e.g., at least 95%, at least 99%, or 100%.

Optionally, an orthographic projection of the first chromogenic layer 15 on the base substrate 11 substantially covers an orthographic projection of the plurality of first columns of light emitting elements 13 on the base substrate 11; and an orthographic projection of the second chromogenic layer 14 on the base substrate 11 substantially covers an orthographic projection of the plurality of first columns of light emitting elements 13 on the base substrate 11.

In some embodiments, at least one of the first chromogenic layer 15 or the second chromogenic layer 14 is an integral unitary layer extending substantially throughout the display substrate 1. Optionally, both of the first chromogenic layer 15 and the second chromogenic layer 14 are integral unitary layers extending substantially throughout the display substrate 1. For example, no patterns on the surfaces of the first chromogenic layer 15 and the second chromogenic layer 14.

Figure 4:
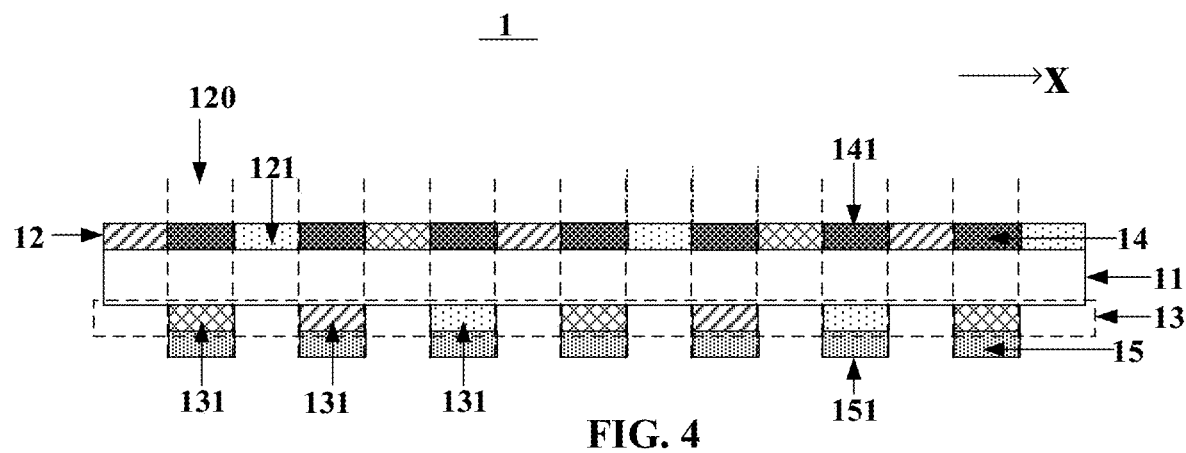
FIG. 4 is a schematic diagram of a structure of a display substrate in some embodiments according to the present disclosure.

FIG. 4 is a schematic diagram of a structure of a display substrate in some embodiments according to the present disclosure. Referring to FIG. 4, in some embodiments, the second chromogenic layer 14 includes a plurality of second chromogenic bars 141 respectively in the plurality of inter-column gap regions 120. Optionally, the plurality of second chromogenic bars 141 and the plurality of second columns of light emitting elements 12 are in a same plane. Optionally, the plurality of second chromogenic bars 141 and the plurality of second columns of light emitting elements 12 are in different planes. Optionally, when the plurality of second chromogenic bars 141 and the plurality of second columns of light emitting elements 12 are in different planes, the inter-bar regions of the plurality of second chromogenic bars 141 is filled with substantially transparent materials, e.g., photoresist materials, glasses, and quartz.

In some embodiments, an orthographic projection of a respective one of the plurality of second chromogenic bars 141 on the base substrate 11 substantially covers an orthographic projection of the respective one the plurality of first columns of light emitting elements 13 on the base substrate 11.

In some embodiments, the first chromogenic layer 15 includes a plurality of first chromogenic bars 151. Optionally, an orthographic projection of a respective one of the plurality of first chromogenic bars 151 on the base substrate 11 substantially covers the orthographic projection of the respective one the plurality of first columns of light emitting elements 13 on the base substrate 11.

In some embodiments, the orthographic projection of a respective one of the plurality of second chromogenic bars 141 on the base substrate 11 and the orthographic projection of a respective one of the plurality of first chromogenic bars 151 on the base substrate 11 are substantially covers the orthographic projection of the respective one the plurality of first columns of light emitting elements 13 on the base substrate 11.

In some embodiments, the plurality of second chromogenic bars 141 form a grating structure. The plurality of first chromogenic bars 151 form a grating structure. For example, both the plurality of second chromogenic bars 141 and the plurality of first chromogenic bars 151 are intermittent gratings.

By forming plurality of second chromogenic bars 141 and the plurality of first chromogenic bars 151 having grating structures, an amount of materials used for forming the plurality of second chromogenic bars 141 and the plurality of first chromogenic bars 151 is reduced, which may reduce the cost of fabricating the display substrate 1.

Various appropriate chromogenic materials are suitable for making the first chromogenic layer 15 and the second chromogenic layer 14. Examples of chromogenic materials suitable for making the first chromogenic layer 15 and the second chromogenic layer 14 include photochromic materials, thermochromic materials, and electrochromic materials changing their color depending on external stimuli.

In some embodiments, the first chromogenic layer 15 and the second chromogenic layer 14 are two different photochromic layers selected from a group consisting of an infrared light photochromic layer and an ultraviolet light photochromic layer. Optionally, a reversible transition between the light emitting state and the light blocking state of the first chromogenic layer 15 can be controlled by irradiating a first light having a first wavelength range on the first chromogenic layer 15. Optionally, a reversible transition between the light emitting state and the light blocking state of the second chromogenic layer 14 can be controlled by irradiating a second light having a second wavelength range on the second chromogenic layer 14. For example, the first wavelength range and the second wavelength ranges are different.

Various appropriate materials may be used for forming an infrared light photochromic layer. Examples of materials suitable for forming the infrared light photochromic layer include, but are not limited to, dithiophene ethylene derivative doped with titanium dioxide nanoparticles, and dithiophene ethylene derivative doped with zinc oxide nanoparticles. For example, when infrared light irradiates on the infrared light photochromic layer, the infrared light photochromic layer can reversibly transition between the light transmitting state and the light blocking state.

Various appropriate materials may be used for forming an ultraviolet light photochromic layer. Examples of materials suitable for forming the ultraviolet light photochromic layer include, but are not limited to, di-dibenzazole-p-cycloarane doped with titanium dioxide nanoparticles, and di-dibenzazole-p-cycloarane doped with zinc oxide nanoparticles. For example, when ultraviolet light irradiates on the ultraviolet light photochromic layer, the ultraviolet light photochromic layer can reversibly transition between the light transmitting state and the light blocking state.

In one example, the first chromogenic layer 15 is the infrared light photochromic layer, and the second chromogenic layer 14 is the ultraviolet light photochromic layer. When infrared light irradiates on the first chromogenic layer 15, the first chromogenic layer 15 can reversibly transition between the light transmitting state and the light blocking state. When ultraviolet light irradiates on the second chromogenic layer 14, the second chromogenic layer 14 can reversibly transition between the light transmitting state and the light blocking state.

In another example, the first chromogenic layer 15 is the ultraviolet light photochromic layer, and the second chromogenic layer 14 is the infrared light photochromic layer. When ultraviolet light irradiates on the first chromogenic layer 15, the first chromogenic layer 15 can reversibly transition between the light transmitting state and the light blocking state. When infrared light irradiates on the second chromogenic layer 14, the second chromogenic layer 14 can reversibly transition between the light transmitting state and the light blocking state.

Figure 5:
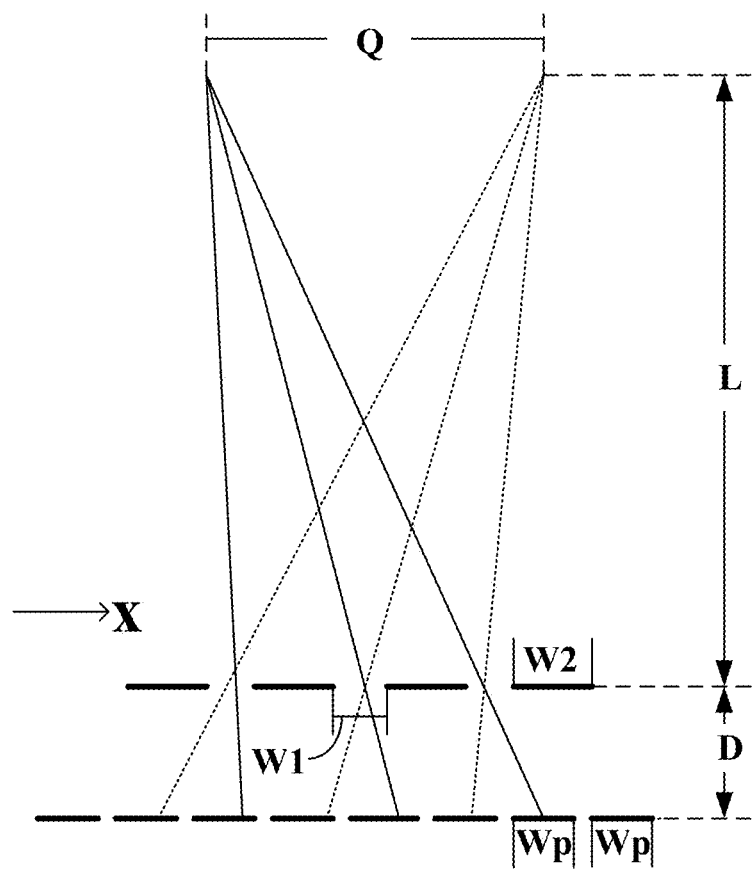
FIG. 5 is a schematic diagram of illustrating a working principle of a three-dimensional display of a display substrate in some embodiments according to the present disclosure.

FIG. 5 is a schematic diagram of illustrating a working principle of a three-dimensional display of a display substrate in some embodiments according to the present disclosure. In some embodiments, referring to FIG. 5 and the right top figure of FIG. 3, the display substrate 1 is configured to display a three-dimensional image. In order to display the three-dimensional image, the plurality of second columns of light emitting elements 12 do not emit light, but function as a parallax barrier grating, and the plurality of first columns of light emitting elements 13 and the plurality of second columns of light emitting elements 12 are spaced apart from each other by a focal length D. In some embodiments, the focal length D may be calculated according to Equation (1):

$$D = \frac{Wp * L}{Q + Wp};  \quad (1)$$

wherein Wp is the pixel width of a respective one of the plurality of first columns of light emitting elements; L is a reading distance between the plurality of second columns of light emitting elements and the first view zone and the second view zone; and Q is a distance between adjacent view zones (e.g., the distance between the first view zone and the second view zone). Optionally, a respective one of the plurality of second columns of light emitting elements has a pixel width substantially the same as Wp.

In some embodiments, the first view zone and the second view zone are a left eye view zone corresponding to a human's left eye and a right eye view zone corresponding to a human's right eye. Optionally, Q is an interpupillary distance of a human. A normal interpupillary distance of a human is in a range of approximately 60 mm to approximately 70 mm, e.g., approximately 65 mm. Optionally, the reading distance L is in a range of approximately 300 mm to approximately 400 mm, e.g., approximately 300 mm to approximately 350 mm and approximately 350 mm to approximately 400 mm. Optionally, the reading distance L is approximately 350 mm. Optionally, Wp is in a range of approximately 1 μm to approximately 1000 μm. Optionally, the focal length D is in a range of approximately 5 mm to approximately 15 mm, e.g., approximately 5 mm to approximately 7.5 mm, approximately 7.5 mm to approximately 10 mm, approximately 10 mm to approximately 12.5 mm, and approximately 12.5 mm to approximately 15 mm. Optionally, the focal length D is approximately 10 mm.

Optionally, the plurality of first columns of light emitting elements 13 and plurality of second columns of light emitting elements 12 have a substantially same pixel width.

Optionally, the plurality of first columns of light emitting elements 13 and plurality of second columns of light emitting elements 12 have different pixel widths.

In some embodiments, a first width W1 of the respective one of the plurality of inter-column gap regions may be calculated according to Equation (2):

$$W1 = \frac{Q * Wp}{Q + Wp};  \quad (2)$$

wherein Wp is the pixel width of a respective one of the plurality of first columns of light emitting elements; and Q is a distance between adjacent view zones (e.g., a distance between the first view zone and the second view zone). Optionally, Wp is a width of a subpixel in the respective one of the plurality of first columns of light emitting elements along the arrangement direction X. Optionally, Wp is a width of a pixel in the respective one of the plurality of first columns of light emitting elements along the arrangement direction X. Optionally, Wp is a column width of the respective one of the plurality of first columns of light emitting elements along the arrangement direction X.

Optionally, W1 is substantially the same as Wp. Optionally, W1 is in a range of approximately 1 μm to approximately 1000 μm.

In some embodiments, a second width W2 (barrier width) of the respective one of the plurality of second columns of light emitting elements may be calculated according to Equation (3):

$$W2 = \frac{K * Q * Wp}{Q + Wp} - W1;  \quad (3)$$

wherein Wp is the pixel width of a respective one of the plurality of first columns of light emitting elements; K is the number of view zones, Q is a distance between adjacent view zones (e.g., the distance between the first view zone and the second view zone when K=2), and W1 is the first width W1 of the respective one of the plurality of inter-column gap regions.

Optionally, W2 is substantially the same as Wp. Optionally, W2 is in a range of approximately 1 μm to approximately 1000 μm.

Figure 6:
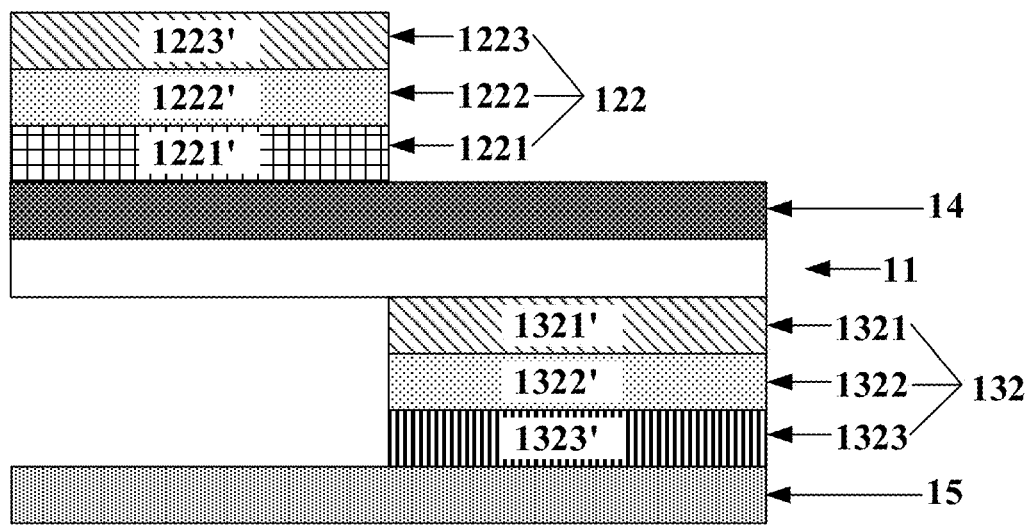
FIG. 6 is a zoom-in view of a partial structure of a display substrate in some embodiments according to the present disclosure.

FIG. 6 is a zoom-in view of a partial structure of a display substrate in some embodiments according to the present disclosure. In some embodiments, referring to FIG. 6, the display substrate 1 is an OLED display substrate includes the respective one of the plurality of first columns of light emitting elements 13 and the respective one of the plurality of second columns of light emitting elements 12. Optionally, the respective one of the plurality of first columns of light emitting elements 13 include the plurality of first subpixels 132. Optionally, the respective one of the plurality of second columns of light emitting elements 12 include the plurality of second subpixels 122.

FIG. 6 shows the zoom-in view including the respective one of the plurality of first subpixels 132 and the respective one of the plurality of second subpixels 122. In some embodiments, the respective one of the plurality of first subpixels 132 includes a first anode 1321 on a side of the base substrate 11 away from the second chromogenic layer 14, a first light emitting layer 1322 on a side of the substantially transparent first anode 1321 away from the second chromogenic layer 14, and a first cathode 1323 on a side of the first light emitting layer 1322 away from the second chromogenic layer 14. Optionally, the first anode 1321 and the first cathode 1323 are substantially transparent, so, the respective one of the plurality of second subpixels 122 is a dual emitting subpixel, and the plurality of first columns of light emitting elements 13 are the plurality of dual emitting light emitting elements.

In some embodiments, the respective one of the plurality of second subpixels 122 includes a second cathode 1221 on a side of the second chromogenic layer 14 away from the base substrate 11, a second light emitting layer 1222 on a side of the second cathode 1221 away from the base substrate 11, and a second anode 1223 on a side of the second light emitting layer 1222 away from the base substrate 11. Optionally, the second anode 1223 is substantially transparent, and the second cathode 1221 is a metal cathode reflecting the light emitted from the second light emitting layer 1222 toward the first direction D1, so the respective one of the plurality of second subpixels 122 is a top emitting subpixel, and the plurality of second columns of light emitting elements 12 are the plurality of top emitting light emitting elements and configured to emit light along the first direction D1.

In some embodiments, the base substrate 11 is a substantially transparent base substrate. Various materials may be used for making the base substrate 11. Examples of materials suitable for making the base substrate include, but are not limited to, substantially transparent non-metallic materials which can form a rigid substrate, and substantially transparent flexible materials which can form a flexible substrate. Optionally, the substantially transparent non-metallic materials forming a rigid substrate includes glass, quartz, and transparent resin. For example, the base substrate 11 is a glass substrate. Optionally, the substantially transparent flexible materials forming the flexible substrate includes polyimide materials.

Various appropriate materials may be used for making the second cathode 1221. Examples of materials suitable for making the second cathode 1221 include, but are not limited to, molybdenum (Mo), copper (Cu), aluminum (Al), titanium (Tl), and alloys including one or more of molybdenum (Mo), copper (Cu), aluminum (Al) and titanium (Tl).

Various appropriate materials may be used for making the first cathode 1323. Examples of materials suitable include, but are not limited to, substantially transparent conductive materials, e.g., substantially transparent conductive metals.

Various appropriate materials may be used for making the first anode 1321 and the second anode 1223. Examples of materials suitable include indium tin oxide, indium zinc oxide, and aluminum-doped zinc oxide.

Various appropriate materials may be used for making the first light emitting layer 1322 and the second light emitting layer 1222. Examples of materials suitable include, but are not limited to organic light emitting materials, e.g., organic light emitting materials emit red light, organic light emitting materials emit green light, and organic light emitting materials emit blue light.

Figure 7:
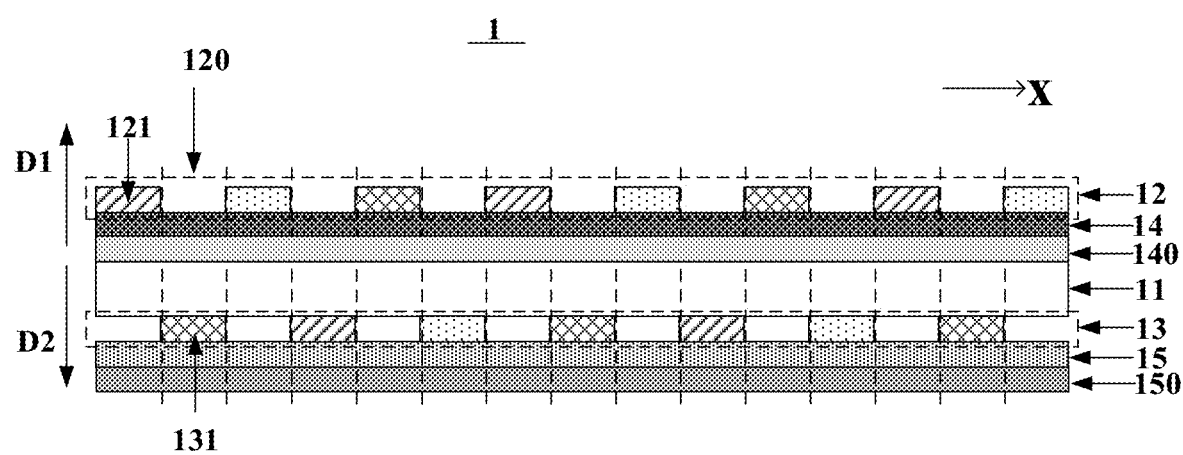
FIG. 7 is a plan view of a structure of a display substrate in some embodiments according to the present disclosure.

FIG. 7 is a plan view of a structure of a display substrate in some embodiments according to the present disclosure. In some embodiments, referring to FIG. 7, the display substrate 1 further includes a first controller 150 configured to control the first chromogenic layer 15 to reversibly transition between the light transmitting state and the light blocking state; and a second controller 140 configured to control the second chromogenic layer 14 to reversibly transition between the light transmitting state and the light blocking state.

Optionally, the first controller 150 is a first substantially transparent layer configured to control light transmitting state of the first chromogenic layer 15 by transmitting the light having the first wavelength range to the first chromogenic layer 15, e.g., infrared light or ultraviolent light. Optionally, the second controller 140 is a second substantially transparent layer configured to control light transmitting state of the second chromogenic layer 14 by transmitting the light having the second wavelength range to the second chromogenic layer 14, e.g., infrared light or ultraviolent light.

In some embodiments, the display substrate 1 further includes a plurality of thin film transistors respectively controlling the plurality of first subpixels and the plurality of second substrate, a pixel definition layer, and an encapsulating structure.

In some embodiments, the plurality of second columns of light emitting elements and the plurality of first columns of light emitting elements are turned on and configured to emit light. When the second chromogenic layer is in the light transmitting state, and the first chromogenic layer is in the light blocking state, the display substrate is in the two-dimensional image display mode, light emitted from both the plurality of second columns of light emitting elements and the plurality of first columns of light emitting elements are transmitting out along the first direction.

In some embodiments, the plurality of second columns of light emitting elements are turned off, the plurality of first columns of light emitting elements are turned on and configured to emit light. When the second chromogenic layer is in the light transmitting state, and the first chromogenic layer is in the light blocking state, the display substrate is in the three-dimensional image display mode, light emitted from the plurality of first columns of light emitting elements are transmitting out along the first direction.

In some embodiments, the plurality of second columns of light emitting elements and the plurality of first columns of light emitting elements are turned on and configured to emit light. When the first chromogenic layer is in the light transmitting state, and the second chromogenic layer is in the light blocking state, the display substrate is in the two-side display mode, light emitted from the plurality of second columns of light emitting elements is transmitting out along the first direction, and light emitted from the plurality of first columns of light emitting elements is transmitting out along the second direction.

So, the display substrate is a multi-functional display substrate, which can perform the two-dimensional image display, the three-dimensional image display, and the two-side display. Also, fabricating a display substrate performing multiple functions can reduce materials used for fabricating multiple display substrates each of which individually has one of the multiple functions, and can also reduce the cost.

In another aspect, the present disclosure also provides a method of fabricating the display substrate described herein. In some embodiments, the method of fabricating the display substrate includes forming a first chromogenic layer; forming a plurality of first columns of light emitting elements on the first chromogenic layer; forming a second chromogenic layer on a side of the plurality of first columns of light emitting elements away from the first chromogenic layer; and forming a plurality of second columns of light emitting elements on a side of the second chromogenic layer away from the first chromogenic layer. Optionally, the plurality of first columns of light emitting elements are arranged substantially along a same direction as the plurality of second columns of light emitting elements. Optionally, the plurality of second columns of light emitting elements are spaced apart by a plurality of inter-column gap regions respectively. Optionally, a respective one of the plurality of first columns of light emitting elements is at least partially in a respective one of the plurality of inter-column gap regions.

In some embodiments, the method of fabricating the display substrate includes forming the plurality of second columns of light emitting elements on a base substrate, forming the plurality of first columns of light emitting elements on a side of the base substrate away from the plurality of second columns of light emitting elements; and forming a plurality of inter-column gap regions respectively spacing apart the plurality of second columns of light emitting elements. Optionally, a respective one of the plurality of first columns of light emitting elements is formed to at least partially in a respective one of the plurality of inter-column gap regions.

Optionally, the plurality of first columns of light emitting elements are a plurality of dual emitting light emitting elements and configured to emit light along a first direction from the plurality of first columns of light emitting elements to the second chromogenic layer and along a second direction from the plurality of first columns of light emitting elements to the first chromogenic layer; and the plurality of second columns of light emitting elements are a plurality of top emitting light emitting elements and configured to emit light along the first direction.

In one example, the plurality of second columns of light emitting elements and the plurality of first columns of light emitting elements are turned on and configured to emit light. When the second chromogenic layer is in the light transmitting state, and the first chromogenic layer is in the light blocking state, the display substrate is in the two-dimensional image display mode, light emitted from both the plurality of second columns of light emitting elements and the plurality of first columns of light emitting elements are transmitting out along the first direction.

In another example, the plurality of second columns of light emitting elements are turned off, the plurality of first columns of light emitting elements are turned on and configured to emit light. When the second chromogenic layer is in the light transmitting state, and the first chromogenic layer is in the light blocking state, the display substrate is in the three-dimensional image display mode, light emitted from the plurality of first columns of light emitting elements are transmitting out along the first direction.

In some embodiments, prior to forming the plurality of second columns of light emitting elements and the plurality of first columns of light emitting elements, the method of fabricating the display substrate includes forming a second chromogenic layer on the base substrate on the base substrate. Optionally, the second chromogenic layer on the base substrate in formed on a side of the base substrate away from the forming the plurality of second columns of light emitting elements. Optionally, the second chromogenic layer on the base substrate in formed on a side of the base substrate away from the plurality of first columns of light emitting elements. Optionally, the second chromogenic layer has a light transmitting state and a light blocking state.

In some embodiments, subsequent to forming the plurality of second columns of light emitting elements and the plurality of first columns of light emitting elements, the method of fabricating the display substrate further includes forming a first chromogenic layer on a side of the plurality of first columns of light emitting elements away from the base substrate. Optionally, the first chromogenic layer has a light transmitting state and a light blocking state.

In some embodiments, the plurality of second columns of light emitting elements and the plurality of first columns of light emitting elements are turned on and configured to emit light. When the second chromogenic layer is in the light transmitting state, and the first chromogenic layer is in the light blocking state, the display substrate is in the two-dimensional image display mode, light emitted from both the plurality of second columns of light emitting elements and the plurality of first columns of light emitting elements are transmitting out along the first direction.

In some embodiments, the plurality of second columns of light emitting elements are turned off, the plurality of first columns of light emitting elements are turned on and configured to emit light. When the second chromogenic layer is in the light transmitting state, and the first chromogenic layer is in the light blocking state, the display substrate is in the three-dimensional image display mode, light emitted from the plurality of first columns of light emitting elements are transmitting out along the first direction.

In some embodiments, the plurality of second columns of light emitting elements and the plurality of first columns of light emitting elements are turned on and configured to emit light. When the first chromogenic layer is in the light transmitting state, and the second chromogenic layer is in the light blocking state, the display substrate is in the two-side display mode, light emitted from the plurality of second columns of light emitting elements is transmitting out along the first direction, and light emitted from the plurality of first columns of light emitting elements is transmitting out along the second direction.

Optionally, the second chromogenic layer is formed using dithiophene ethylene derivative doped with titanium dioxide nanoparticles or dithiophene ethylene derivative doped with zinc oxide nanoparticles. Optionally, the first chromogenic layer is formed using di-dibenzazole-p-cycloarane doped with titanium dioxide nanoparticles or di-dibenzazole-p-cycloarane doped with zinc oxide nanoparticles.

Optionally, the first chromogenic layer is formed using dithiophene ethylene derivative doped with titanium dioxide nanoparticles or dithiophene ethylene derivative doped with zinc oxide nanoparticles. Optionally, the second chromogenic layer is formed using di-dibenzazole-p-cycloarane doped with titanium dioxide nanoparticles or di-dibenzazole-p-cycloarane doped with zinc oxide nanoparticles.

In some embodiments, forming the plurality of second columns of light emitting elements includes forming a plurality of second subpixels. Optionally, forming a respective one of the plurality of second subpixels includes forming a second cathode on a side of the second chromogenic layer away from the base substrate, forming a second light emitting layer on a side of the second cathode away from the base substrate, and forming a second anode on a side of the second light emitting layer away from the base substrate. Optionally, the second anode is substantially transparent, and the second cathode is a metal cathode reflecting the light emitted from the second light emitting layer toward the first direction, so the respective one of the plurality of second subpixels is a top emitting subpixel, and the plurality of second columns of light emitting elements are the plurality of top emitting light emitting elements and configured to emit light along the first direction.

In some embodiments, forming the plurality of first columns of light emitting elements includes forming a plurality of first subpixels. Optionally, forming the plurality of first subpixels includes forming a first anode on a side of the base substrate away from the second chromogenic layer, a first light emitting layer on a side of the substantially transparent first anode away from the second chromogenic layer, and a first cathode on a side of the first light transmitting layer away from the second chromogenic layer. Optionally, the first anode and the first cathode are substantially transparent, so, the respective one of the plurality of second subpixels is a dual emitting subpixel, and the plurality of first columns of light emitting elements are the plurality of dual emitting light emitting elements.

The method described herein of fabricating the display substrate can fabricating the display substrate having multiple display functions, including the two-dimensional image display, the three-dimensional image display, and the two-side display.

Figure 8:
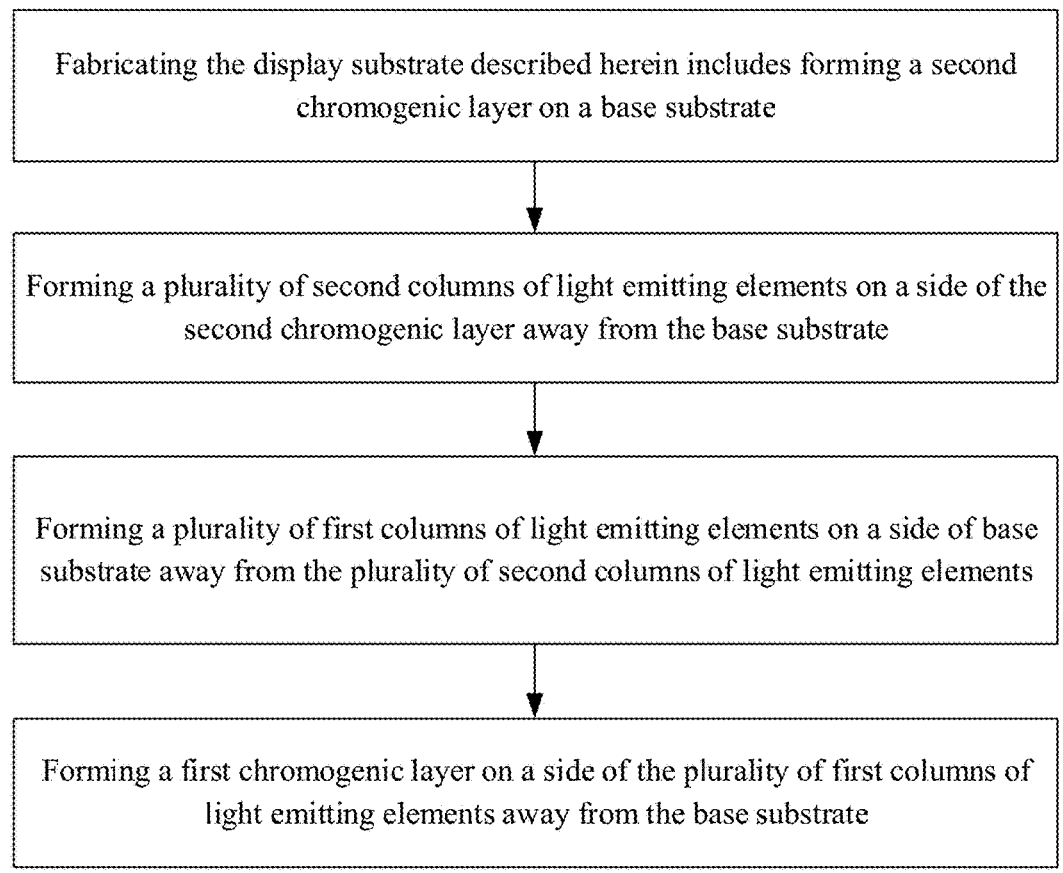
FIG. 8 is a flow chart illustrating a method of fabricating a display substrate in some embodiments according to the present disclosure.

FIG. 8 is a flow chart illustrating a method of fabricating a display substrate in some embodiments according to the present disclosure. Referring to FIG. 8, in some embodiments, the method of fabricating the display substrate described herein includes forming a second chromogenic layer on a base substrate. Optionally, the second chromogenic layer has a light transmitting state and a light blocking state.

Referring to the left figure of FIG. 3, the second chromogenic layer 14 is configured to reversibly transition between the light transmitting state and the light blocking state. Optionally, the second chromogenic layer 14 is an infrared light photochromic layer. Optionally, the second chromogenic layer 14 is made of dithiophene ethylene derivative doped with titanium dioxide nanoparticles or dithiophene ethylene derivative doped with zinc oxide nanoparticles.

Optionally, the second chromogenic layer 14 is formed on the base substrate using methods including, but not limited to, plasma enhanced chemical vapor deposition (PECVD), magnetron sputtering, and thermal evaporation.

Optionally, referring to FIG. 4, the second chromogenic layer 14 is formed to have a plurality of second chromogenic bars 141 respectively in the plurality of inter-column gap regions 120. In one example, forming the plurality of second chromogenic bars 141 includes forming a second chromogenic material layer, and patterning the second chromogenic material layer to form the plurality of second chromogenic bars 141. In another example, the plurality of second chromogenic bars 141 is formed using inkjet printing.

In some embodiments, referring to the left figure of FIG. 3, the method of fabricating the display substrate includes forming a plurality of second columns of light emitting elements 12 on a side of the second chromogenic layer 14 away from the base substrate 11, and forming a plurality of inter-column gap regions 120 to respectively space apart the plurality of second columns of light emitting elements. Optionally, the plurality of second columns of light emitting elements 12 are arranged along a direction X.

Optionally, the plurality of second columns of light emitting elements 12 are a plurality of top emitting light emitting elements and configured to emit light in a first direction away from the base substrate 11.

Optionally, a respective one of the plurality of second columns of light emitting elements 12 is formed to include a plurality of rows of second light emitting elements 121. Optionally, a respective one of the plurality of rows of second light emitting elements 121 is formed to include a plurality of second subpixels 122 (see FIG. 2E). Optionally, the respective one of the plurality of rows of second light emitting elements 121 is formed to include a single second subpixel of the plurality of second subpixels 122 (see FIG. 2F).

Optionally, referring to FIG. 6, forming the respective one of the plurality of second subpixels 122 includes forming a second cathode 1221 on a side of the second chromogenic layer 14 away from the base substrate 11, forming a second light emitting layer 1222 on a side of the second cathode 1221 away from the base substrate 11, and forming a second anode 1223 on a side of the second light emitting layer 1222 away from the base substrate 11.

Optionally, the second cathode 1221 is formed using materials including, but not limited to, molybdenum (Mo), copper (Cu), aluminum (Al), titanium (Tl), and alloys including one or more of molybdenum (Mo), copper (Cu), aluminum (Al) and titanium (Tl).

Optionally, the second light emitting layer 1222 is formed using materials including, but not limited to organic light emitting materials, e.g., organic light emitting materials emit red light, organic light emitting materials emit green light, and organic light emitting materials emit blue light.

Optionally, the second anode 1223 is formed using materials including, but not limited to indium tin oxide, indium zinc oxide, and aluminum-doped zinc oxide.

For example, forming the respective one of the plurality of second subpixels 122 includes forming a second cathode material layer 1221' on a side of the second chromogenic layer 14 away from the base substrate 11 using methods including, but not limited to, plasma enhanced chemical vapor deposition (PECVD), magnetron sputtering, and thermal evaporation; and patterning the second cathode material layer 1221' to form the second cathode 1221. Optionally, the second cathode material layer 1221' is a metallic material layer (e.g., a molybdenum (Mo) layer).

Subsequent to forming the second cathode 1221, forming the respective one of the plurality of second subpixels 122 further includes forming a second light emitting material layer 1222' on a side of the second cathode 1221 away from the base substrate 11 using methods including, but not limited to, plasma enhanced chemical vapor deposition (PECVD), magnetron sputtering, and thermal evaporation; and patterning the second light emitting material layer 1222' to form the a second light emitting layer 1222. Optionally, the respective one of the plurality of second subpixels 122 is selected from a group consisting of the subpixel in red color, the subpixel in green color, and the subpixel in blue color. So, according to different color of subpixels, the materials used to form the second light emitting materials layer in subpixels having different colors are different.

Subsequent to forming the second light emitting layer 1222, forming the respective one of the plurality of second subpixels 122 further includes forming a second anode material layer 1223' on a side of the second light emitting layer 1222 away from the base substrate 11 using methods including, but not limited to, plasma enhanced chemical vapor deposition (PECVD), magnetron sputtering, and thermal evaporation; and patterning the second anode material layer 1223' to form a second anode 1223. Optionally, the second anode material layer 1223' is a substantially transparent material layer including ITO.

In some embodiments, referring to the left figure of FIG. 3, the method of fabricating the display substrate includes forming a plurality of first columns of light emitting elements 13 on a side of base substrate 11 away from the plurality of second columns of light emitting elements 12. Optionally, the plurality of first columns of light emitting elements 13 are arranged substantially along a same direction as the plurality of second columns of light emitting elements 12. Optionally, the respective one of the plurality of first columns of light emitting elements 13 is at least partially in the respective one of the plurality of inter-column gap regions 120

Optionally, an orthographic projection of a respective one the plurality of first columns of light emitting elements 13 on the base substrate 11 is at least partially non-overlapping with an orthographic projection of the plurality of second columns of light emitting elements 12 on the base substrate 11; and an orthographic projection of a respective one the plurality of second columns of light emitting elements 12 on the base substrate 11 is at least partially non-overlapping with an orthographic projection of the plurality of first columns of light emitting elements 13 on the base substrate 11.

Optionally, the plurality of first columns of light emitting elements 13 are a plurality of dual emitting light emitting elements and configured to emit light along the first direction from the plurality of first columns of light emitting elements 13 to the second chromogenic layer 14 and along a second direction away from the base substrate 11.

Optionally, a respective one of the plurality of first columns of light emitting elements 13 is formed to include a plurality of rows of first light emitting elements 131. Optionally, a respective one of the plurality of rows of first light emitting elements 131 is formed to include a plurality of first subpixels 132 (see FIG. 2E). Optionally, the respective one of the plurality of rows of first light emitting elements 131 is formed to include a single first subpixel of the plurality of first subpixels 132 (see FIG. 2F).

Optionally, referring to FIG. 6, forming the respective one of the plurality of first subpixels 132 includes forming a first anode 1321 on a side of the base substrate 11 away from the respective one of the plurality of second subpixels 122; forming a first light emitting layer 1322 on a side of the substantially transparent first anode 1321 away from the base substrate 11; and forming a first cathode 1323 on a side of the first light emitting layer 1322 away from first light emitting layer 1322.

For example, forming the respective one of the plurality of first subpixels 132 includes forming a first anode material layer 1321' on a side of base substrate 11 away from the plurality of second subpixels using methods including, but not limited to, plasma enhanced chemical vapor deposition (PECVD), magnetron sputtering, and thermal evaporation; and patterning the first anode material layer 1321' to form the first anode 1321. Optionally, the first anode material layer 1321' is a substantially transparent conductive metallic material layer.

Subsequent to forming the first anode 1321, forming the respective one of the plurality of first subpixels 132 further includes forming a first light emitting material layer 1322' on a side of the first anode 1321 away from the base substrate 11 using methods including, but not limited to, plasma enhanced chemical vapor deposition (PECVD), magnetron sputtering, and thermal evaporation; and patterning the first light emitting material layer 1322' to form the a first light emitting layer 1322. Optionally, the respective one of the plurality of first subpixels 132 is selected from a group consisting of the subpixel in red color, the subpixel in green color, and the subpixel in blue color. So, according to different color of subpixels, the materials used to form the first light emitting materials layer in subpixels having different colors are different.

Subsequent to forming the first light emitting layer 1322, forming the respective one of the plurality of first subpixels 132 further includes forming a first cathode material layer 1323' on a side of the first light emitting layer 1322 away from the first anode 1321 using methods including, but not limited to, plasma enhanced chemical vapor deposition (PECVD), magnetron sputtering, and thermal evaporation; and patterning the first cathode material layer 1323' to form a first cathode 1323. Optionally, the first cathode material layer 1323' is a substantially transparent material layer including ITO.

In some embodiments, referring to the left figure of FIG. 3, the method of fabricating the display substrate includes forming a first chromogenic layer 15 on a side of the plurality of first columns of light emitting elements 13 away from the base substrate 11. The first chromogenic layer 15 is formed to reversibly transition between a light transmitting state and a light blocking state.

Optionally, the first chromogenic layer 15 is an ultraviolent light photochromic layer. Optionally, the first chromogenic layer 15 is made of di-dibenzazole-p-cycloarane doped with titanium dioxide nanoparticles or di-dibenzazole-p-cycloarane doped with zinc oxide nanoparticles.

Optionally, a first chromogenic layer 15 is formed on a side of the plurality of first columns of light emitting elements 13 away from the base substrate 11 using methods including, but not limited to, plasma enhanced chemical vapor deposition (PECVD), magnetron sputtering, and thermal evaporation.

Optionally, referring to FIG. 4, the first chromogenic layer 15 is formed to have a plurality of first chromogenic bars 151 respectively in the plurality of inter-column gap regions 120. In one example, forming the plurality of first chromogenic bars 151 includes forming a first chromogenic material layer, and patterning the first chromogenic material layer to form the plurality of first chromogenic bars 151. In another example, the plurality of second chromogenic bars 141 is formed using inkjet printing.

Optionally, an orthographic projection of a respective one of the plurality of first chromogenic bars 151 on the base substrate 11 substantially covers an orthographic projection of a respective one the plurality of first columns of light emitting elements 13 on the base substrate 11.

Various appropriate methods may be used to pattern a layer. Examples of method suitable for patterning a layer includes a lithography process. Using the lithography process for patterning a layer include, but are not limited to, coating photoresist, exposing, developing, etching, and stripping the photoresist.

In some embodiments, in the display substrate fabricated by the method described herein, the plurality of second columns of light emitting elements and the plurality of first columns of light emitting elements are turned on and configured to emit light. When the second chromogenic layer is in the light transmitting state, and the first chromogenic layer is in the light blocking state, the display substrate is in the two-dimensional image display mode, light emitted from both the plurality of second columns of light emitting elements and the plurality of first columns of light emitting elements are transmitting out along the first direction.

In some embodiments, in the display substrate fabricated by the method described herein, the plurality of second columns of light emitting elements are turned off, the plurality of first columns of light emitting elements are turned on and configured to emit light. When the second chromogenic layer is in the light transmitting state, and the first chromogenic layer is in the light blocking state, the display substrate is in the three-dimensional image display mode, light emitted from the plurality of first columns of light emitting elements are transmitting out along the first direction.

In some embodiments, in the display substrate fabricated by the method described herein, the plurality of second columns of light emitting elements and the plurality of first columns of light emitting elements are turned on and configured to emit light. When the first chromogenic layer is in the light transmitting state, and the second chromogenic layer is in the light blocking state, the display substrate is in the two-side display mode, light emitted from the plurality of second columns of light emitting elements is transmitting out along the first direction, and light emitted from the plurality of first columns of light emitting elements is transmitting out along the second direction.

In another aspect, the present disclosure also provides a display apparatus. In some embodiments, the display apparatus includes the display substrate described herein; and one or more integrated circuits connected to the display substrate.

In some embodiments, referring to FIG. 3 and FIG. 4, when the second chromogenic layer 14 is an infrared light photochromic layer, and the first chromogenic layer 15 is a ultraviolet light photochromic layer, the display apparatus further includes an infrared light source and an ultraviolet light source respectively connected with the first chromogenic layer and the second chromogenic layer.

Figure 9:
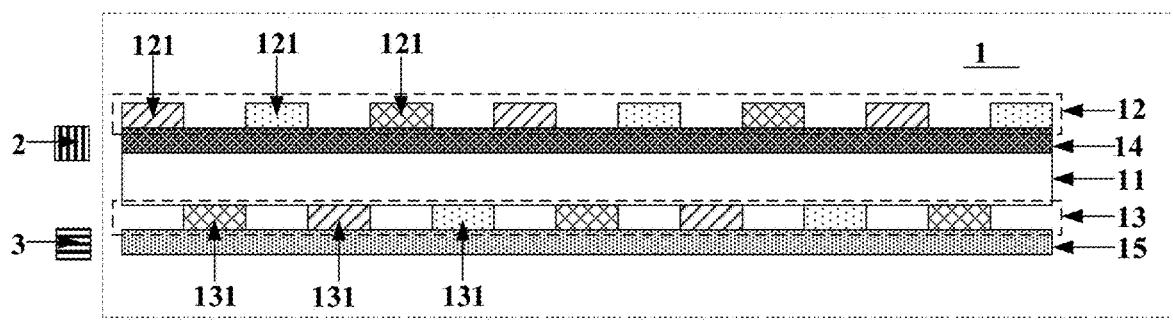
FIG. 9 is a schematic diagram of a structure of a display apparatus in some embodiments according to the present disclosure.

FIG. 9 is a schematic diagram of a structure of a display apparatus in some embodiments according to the present disclosure. In some embodiments, referring to FIG. 9, the display apparatus includes a display substrate 1 described herein, an infrared light source 2, and an ultraviolet light source 3.

Optionally, the infrared light source 2 is on a lateral side of the second chromogenic layer 14. For example, the infrared light source 2 is configured to emit a second light having a second wavelength range. Optionally, the ultraviolent light source 3 is on a lateral side of the first chromogenic layer 15. For example, the ultraviolet light source 3 is configured to emit a first light having a first wavelength range.

Optionally, referring to FIG. 7 and FIG. 9, the infrared light source 2 is on a lateral side of the second controller 140 (e.g., a second substantially transparent layer) to allow the second light having the second wavelength range to irradiate at the second chromogenic layer 14. The ultraviolet light source 3 is on a lateral side of the first controller 150 (e.g., a first substantially transparent layer) to allow the first light having the first wavelength range to irradiate at the first chromogenic layer 15.

Optionally, in order for the second chromogenic layer 14 and the first chromogenic layer 15 work properly, the light emitted from the infrared light source 2 is prevented from irradiating on the first chromogenic layer 15, and the light emitted from the ultraviolet light source 3 is prevented from irradiating on the second chromogenic layer 14.

Optionally, at least one of the infrared light source 2 and the ultraviolet light source 3 includes a transmitter and a receiver. By adjusting the transmitter and the receiver, the light emitted from the at least one of the infrared light source 2 and the ultraviolet light source 3 can have a selected wavelength range. In one example, the transmitter and the receiver of the infrared light source 2 are adjusted to emit the second light having the second wavelength range, e.g., the infrared light. In another example, the transmitter and the receiver of the ultraviolet light source 3 are adjusted to emit the first light having the first wavelength range, e.g., the ultraviolet light.

Optionally, the infrared light source 2 and the ultraviolet light source 3 are connected to the one or more integrated circuits in the display apparatus, so, the infrared light source 2 and the ultraviolet light source 3 are controlled by the one or more integrated circuits.

In some embodiments, the display apparatus further includes an encapsulating structure. Optionally, the infrared light source 2 and the ultraviolet light source 3 are within the encapsulating structure.

Examples of appropriate display apparatuses include, but are not limited to, an electronic paper, a mobile phone, a tablet computer, a television, a monitor, a notebook computer, a digital album, a GPS, etc. Optionally, the display apparatus has a multiple display functions includes a two-dimensional image display mode, a three-dimensional image display mode, and a two-side display mode.

In another aspect, the present disclosure also provides a method of controlling the display substrate described herein. In some embodiments, the display substrate includes a first chromogenic layer; a plurality of first columns of light emitting elements on the first chromogenic layer; a second chromogenic layer on a side of the plurality of first columns of light emitting elements away from the first chromogenic layer; and a plurality of second columns of light emitting elements on a side of the second chromogenic layer away from the first chromogenic layer. Optionally, the plurality of first columns of light emitting elements are arranged substantially along a same direction as the plurality of second columns of light emitting elements. Optionally, the plurality of second columns of light emitting elements are spaced apart by a plurality of inter-column gap regions respectively. Optionally, a respective one of the plurality of first columns of light emitting elements is at least partially in a respective one of the plurality of inter-column gap regions.

Optionally, the display substrate further includes a first controller configured to control the first chromogenic layer to reversibly transition between a light transmitting state and a light blocking state; and a second controller configured to control the second chromogenic layer to reversibly transition between the light transmitting state and the light blocking state. Optionally, when the second chromogenic layer is an infrared light photochromic layer, and the first chromogenic layer is an ultraviolet light photochromic layer, the second controller configured to control the second chromogenic layer emits infrared light, and the first controller configured to control the first chromogenic layer emits ultraviolet light.

In some embodiments, the method of controlling the display substrate includes controlling the plurality of first columns of light emitting elements to reversibly transition between a turned-on state and a turned-off state; controlling the plurality of second columns of light emitting elements to reversibly transition between the turned-on state and the turned-off state; controlling the first chromogenic layer to reversibly transition between a light transmitting state and a light blocking state; and controlling the second chromogenic layer to reversibly transition between a light transmitting state and a light blocking state.

Figure 10:
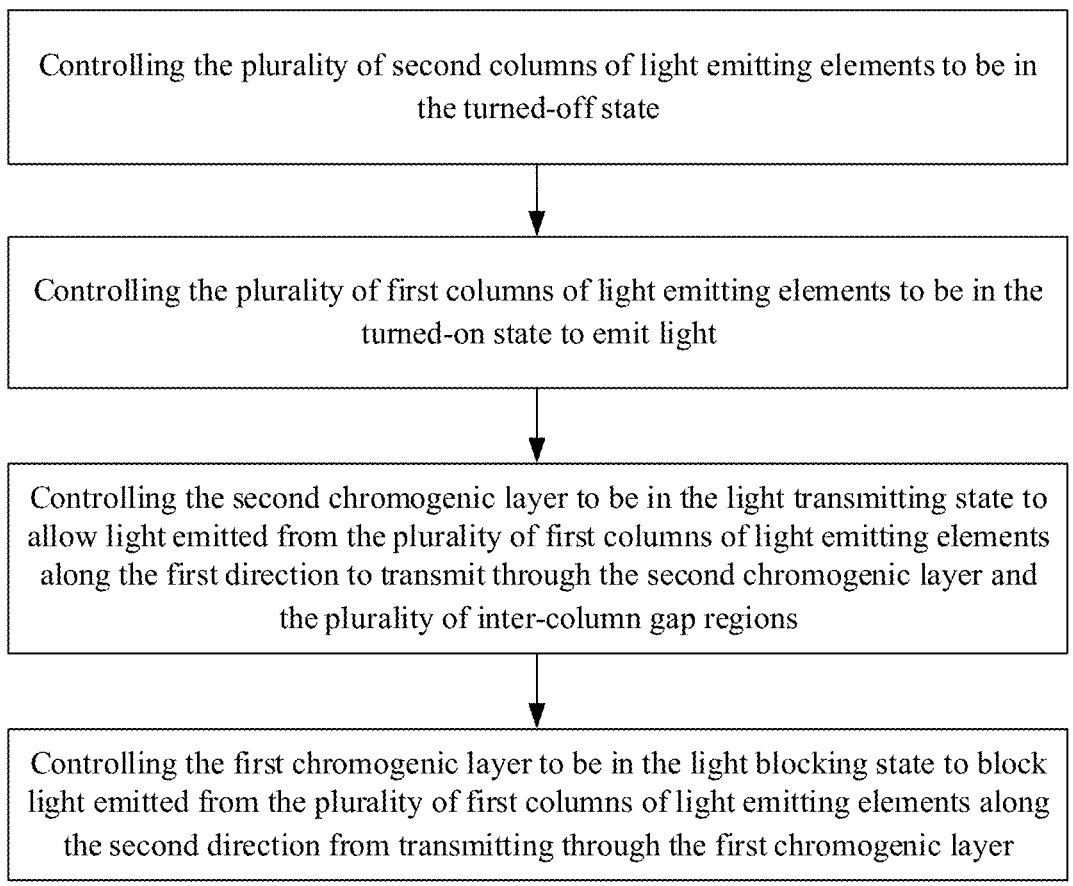
FIG. 10 is a flow chart illustrating a method of operating the display substrate in a three-dimensional image display mode in some embodiments according to the present disclosure.

FIG. 10 is a flow chart illustrating a method of operating the display substrate in a three-dimensional image display mode in some embodiments according to the present disclosure. referring to FIG. 10, in some embodiments, the method of controlling the display substrate includes operating the display substrate in a three-dimensional image display mode. In some embodiments, operating the display substrate in the three-dimensional image display mode includes controlling the plurality of second columns of light emitting elements to be in the turned-off state; controlling the plurality of first columns of light emitting elements to be in the turned-on state to emit light; controlling the second chromogenic layer to be in the light transmitting state to allow light emitted from the plurality of first columns of light emitting elements along the first direction to transmit through the second chromogenic layer and the plurality of inter-column gap regions; and controlling the first chromogenic layer to be in the light blocking state to block light emitted from the plurality of first columns of light emitting elements along the second direction from transmitting through the first chromogenic layer.

Optionally, controlling the second chromogenic layer to be in the light transmitting state includes controlling the second controller not to emit infrared light. Optionally, controlling the first chromogenic layer to be in a light blocking state includes controlling the first controller to emit ultraviolent light.

FIG. 11 is a flow chart illustrating a method of operating the display substrate in a two-dimensional image display mode in some embodiments according to the present disclosure. referring to FIG. 11, in some embodiments, the method of controlling the display substrate includes operating the display substrate in a two-dimensional image display mode. In some embodiments, operating the display substrate in a two-dimensional image display mode includes controlling both the plurality of first columns of light emitting elements and the plurality of second columns of light emitting elements to be in the turned-on state to emit light; controlling the second chromogenic layer to be in the light transmitting state to allow light emitted from the plurality of first columns of light emitting elements along the first direction to transmit through the second chromogenic layer and the plurality of inter-column gap regions; and controlling the first chromogenic layer to be in a light blocking state to block light emitted from the plurality of first columns of light emitting elements along the second direction from transmitting through the first chromogenic layer.

Optionally, controlling the second chromogenic layer to be in the light transmitting state includes controlling the second controller not to emit infrared light. Optionally, controlling the first chromogenic layer to be in a light blocking state includes controlling the first controller to emit ultraviolent light.

FIG. 12 is a flow chart illustrating a method of operating the display substrate in a two-side display mode in some embodiments according to the present disclosure. Referring to FIG. 12, in some embodiments, the method of controlling the display substrate includes operating the display substrate in a two-side display mode. In some embodiments, operating the display substrate in the two-side display mode includes controlling both the plurality of first columns of light emitting elements and the plurality of second columns of light emitting elements to be in the turned-on state to emit light; controlling the second chromogenic layer to be in the light blocking state to block light emitted from the plurality of first columns of light emitting elements along the first direction from transmitting through the second chromogenic layer; and controlling the first chromogenic layer to be in the light transmitting state to allow light emitted from the plurality of first columns of light emitting elements along the second direction to transmit through the first chromogenic layer.

Optionally, controlling the second chromogenic layer to be in the light blocking state includes controlling the second controller to emit infrared light. Optionally, controlling the first chromogenic layer to be in the light transmitting state includes controlling the first controller not to emit ultraviolent light.

Figure 13:
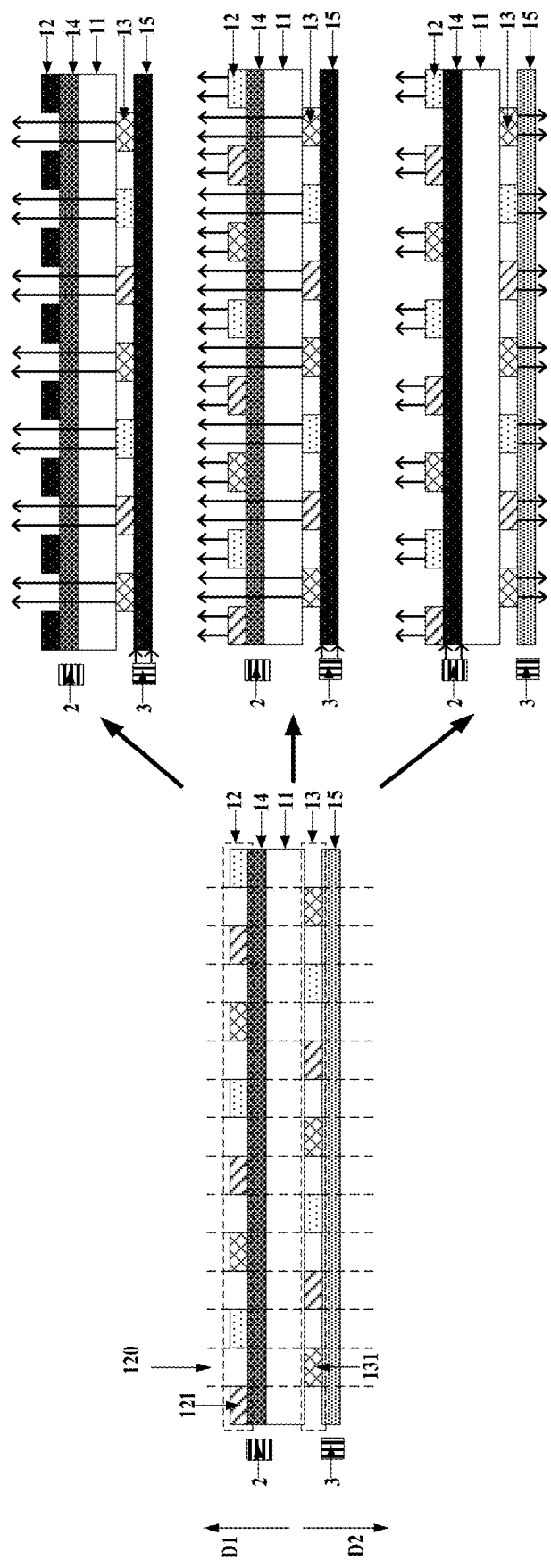
FIG. 13 is a schematic diagram of a display apparatus performing three different displaying modes in some embodiments according to the present disclosure.

In another aspect, the present disclosure also provide a method of controlling a display apparatus having the display substrate described herein. FIG. 13 is a schematic diagram of a display apparatus performing three different displaying modes in some embodiments according to the present disclosure. A left figure of FIG. 13 is a schematic diagram of a structure of a display apparatus. A right top figure of FIG. 13 is a schematic diagram of a display apparatus in a three-dimensional image display mode. A right middle figure of FIG. 13 is a schematic diagram of a display apparatus in a two-dimensional image display mode. A right bottom figure of FIG. 13 is a schematic diagram of a display apparatus in a two-side display mode. In some embodiments, the display apparatus in FIG. 13 includes the display substrate 1 described herein, and an infrared light source 2 and an ultraviolent light source 3 respectively connected with the first chromogenic layer and the second chromogenic layer.

Referring to FIG. 10 and the right top figure of FIG. 13, in some embodiments, the method of controlling the display apparatus in the three-dimensional image display mode includes controlling the plurality of second columns of light emitting elements 12 to be in the turned-off state; controlling the plurality of first columns of light emitting elements 13 to be in the turned-on state to emit light; controlling the second chromogenic layer 14 to be in the light transmitting state to allow light emitted from the plurality of first columns of light emitting elements 13 along the first direction D1 to transmit through the second chromogenic layer 14 and the plurality of inter-column gap regions 120; and controlling the first chromogenic layer 15 to be in the light blocking state to block light emitted from the plurality of first columns of light emitting elements 13 along the second direction D2 from transmitting through the first chromogenic layer 15. Optionally, the light emitted from the plurality of first columns of light emitting elements 13 transmits along the first direction D1 and transmits through Optionally, controlling the second chromogenic layer 14 to be in the light transmitting state includes controlling the infrared light source 2 not to emit infrared light. For example, when the infrared light source 2 doesn't emit infrared light, no infrared light will irradiate on the second chromogenic layer 14, the transparency of the second chromogenic layer 14 is not changed, so the second chromogenic layer 14 is substantially transparent and is in the light transmitting state. Optionally, controlling the first chromogenic layer 15 to be in the light blocking state includes controlling the ultraviolent light source 3 to emit ultraviolet light. For example, when the ultraviolent light source 3 emit ultraviolet light on the first chromogenic layer 15, the transparency of the first chromogenic layer 15 changes from a substantially transparent state to a substantially non-transparent state, so the first chromogenic layer 15 is in the light blocking state.

For example, the light emitted from the plurality of first columns of light emitting elements 13 transmits along the first direction D1 and transmits through the base substrate 11, the second chromogenic layer 14, and the plurality of inter-column gap regions 120. The plurality of second columns of light emitting elements 12 function as a grating to allow the display apparatus to perform three-dimensional image display mode.

Referring to FIG. 11 and the right middle figure of FIG. 13, in some embodiments, the method of controlling the display apparatus in the two-dimensional image display mode includes controlling both the plurality of first columns of light emitting elements 13 and the plurality of second columns of light emitting elements 12 to be in the turned-on state to emit light; controlling the second chromogenic layer 14 to be in the light transmitting state to allow light emitted from the plurality of first columns of light emitting elements 13 along the first direction D1 to transmit through the second chromogenic layer 14 and the plurality of inter-column gap regions 120; and controlling the first chromogenic layer 15 to be in a light blocking state to block light emitted from the plurality of first columns of light emitting elements 13 along the second direction D2 from transmitting through the first chromogenic layer 15.

Optionally, controlling the second chromogenic layer 14 to be in the light transmitting state includes controlling the infrared light source 2 not to emit infrared light. For example, when the infrared light source 2 doesn't emit infrared light, no infrared light will irradiate on the second chromogenic layer 14, the transparency of the second chromogenic layer 14 is not changed, so the second chromogenic layer 14 is substantially transparent and is in the light transmitting state. Optionally, controlling the first chromogenic layer 15 to be in the light blocking state includes controlling the ultraviolent light source 3 to emit ultraviolent light. For example, when the ultraviolent light source 3 emit ultraviolent light on the first chromogenic layer 15, the transparency of the first chromogenic layer 15 changes from a substantially transparent state to a substantially non-transparent state, so the first chromogenic layer 15 is in the light blocking state.

For example, the light emitted from the plurality of first columns of light emitting elements 13 transmits along the first direction D1 and transmits through the base substrate 11, the second chromogenic layer 14, and the plurality of inter-column gap regions 120. The plurality of second columns of light emitting elements 12 also emit light along the first direction D1, so the plurality of first columns of light emitting elements 13 and the plurality of second columns of light emitting elements 12 together perform the two-dimensional image display.

Referring to FIG. 12 and the right bottom figure of FIG. 13, in some embodiments, the method of controlling the display apparatus in the two-side display mode includes controlling both the plurality of first columns of light emitting elements 13 and the plurality of second columns of light emitting elements 12 to be in the turned-on state to emit light; controlling the second chromogenic layer 14 to be in the light blocking state to block light emitted from the plurality of first columns of light emitting elements 13 along the first direction D1 from transmitting through the second chromogenic layer 14; and controlling the first chromogenic layer 15 to be in the light transmitting state to allow light emitted from the plurality of first columns of light emitting elements 13 along the second direction D2 to transmit through the first chromogenic layer 15.

Optionally, controlling the second chromogenic layer 14 to be in the light blocking state includes controlling the infrared light source 2 to emit infrared light. For example, when the infrared light source 2 emits infrared light on the second chromogenic layer 14, the second chromogenic layer 14 changed from a substantially transparent state to a substantially non-transparent state, so the second chromogenic layer 14 is in the light blocking state. Optionally, controlling the first chromogenic layer 15 to be in the light transmitting state includes controlling the ultraviolent light source 3 not to emit ultraviolent light. For example, when the ultraviolent light source 3 does not emit ultraviolent light, no ultraviolent light irradiates on the first chromogenic layer 15, the transparency of the first chromogenic layer 15 is not changed, so the first chromogenic layer 15 is substantially transparent and is in a light transmitting state.

For example, the light emitted from the plurality of first columns of light emitting elements 13 transmits along the second direction D2 and transmits through first chromogenic layer 15. The light emitting from the plurality of first columns of light emitting elements 13 transmits along the first direction D1, so the plurality of first columns of light emitting elements 13 and the plurality of second columns of light emitting elements 12 can respectively display images on two opposing side of the display apparatus.

In some embodiments, the display apparatus further includes one or more integrated circuits connected the display substrate described herein. In one example, one of the one or more integrated circuits can control the plurality of first columns of light emitting elements and the plurality of second columns of light emitting elements to reversibly transition between the turned-on state and the turned-off state. In another example, one of the one or more integrated circuits can control the first chromogenic layer and the second chromogenic layer to reversibly transition the light transmitting state and the light blocking state.

In some embodiments, referring to FIG. 13 and FIG. 6, a respective one of the plurality of first columns of light emitting elements 13 is formed to include a plurality of rows of first light emitting elements 131. Optionally, a respective one of the plurality of rows of first light emitting elements 131 is formed to include a plurality of first subpixels 132 (see FIG. 2E). Optionally, the respective one of the plurality of rows of first light emitting elements 131 is formed to include a single first subpixel of the plurality of first subpixels 132 (see FIG. 2F).

Optionally, the respective one of the plurality of first subpixels 132 includes a first anode 1321 on a side of the base substrate 11 away from the respective one of the plurality of second subpixels 122; a first light emitting layer 1322 on a side of the substantially transparent first anode 1321 away from the base substrate 11; and a first cathode 1323 on a side of the first light emitting layer 1322 away from first light emitting layer 1322.

Optionally, the respective one of the plurality of second subpixels 122 includes a second cathode 1221 on a side of the second chromogenic layer 14 away from the base substrate 11, a second light emitting layer 1222 on a side of the second cathode 1221 away from the base substrate 11, and a second anode 1223 on a side of the second light emitting layer 1222 away from the base substrate 11.

In one example, controlling the plurality of first columns of light emitting elements 13 to reversibly transition between the turned-on state and the turned-off state includes controlling the respective one of the plurality of first subpixels 132 to reversibly transition between the turned-on state and the turned-off state. Optionally, controlling the respective one of the plurality of first subpixels 132 to reversibly transition between the turned-on state and the turned-off state includes sending electrical signals to the first anode 1321 and the first cathode 1323 to control the light emitted from the first light emitting layer 1322.

In another example, controlling the plurality of second columns of light emitting elements 12 to reversibly transition between the turned-on state and the turned-off state includes controlling the respective one of the plurality of second subpixels 122 to reversibly transition between the turned-on state and the turned-off state. Optionally, controlling the respective one of the plurality of second subpixels 122 to reversibly transition between the turned-on state and the turned-off state includes sending electrical signals to the second anode 1223 and the second cathode 1221 to control the light emitted from the second light emitting layer 1222.

In some embodiments, using the method of controlling the display substrate and the method of controlling the display apparatus, the plurality of second columns of light emitting elements and the plurality of first columns of light emitting elements are turned on and configured to emit light. When the second chromogenic layer is in the light transmitting state, and the first chromogenic layer is in the light blocking state, the display substrate is in the two-dimensional image display mode, light emitted from both the plurality of second columns of light emitting elements and the plurality of first columns of light emitting elements are transmitting out along the first direction.

In some embodiments, using the method of controlling the display substrate and the method of controlling the display apparatus, the plurality of second columns of light emitting elements are turned off, the plurality of first columns of light emitting elements are turned on and configured to emit light. When the second chromogenic layer is in the light transmitting state, and the first chromogenic layer is in the light blocking state, the display substrate is in the three-dimensional image display mode, light emitted from the plurality of first columns of light emitting elements are transmitting out along the first direction.

In some embodiments, using the method of controlling the display substrate and the method of controlling the display apparatus, the plurality of second columns of light emitting elements and the plurality of first columns of light emitting elements are turned on and configured to emit light. When the first chromogenic layer is in the light transmitting state, and the second chromogenic layer is in the light blocking state, the display substrate is in the two-side display mode, light emitted from the plurality of second columns of light emitting elements is transmitting out along the first direction, and light emitted from the plurality of first columns of light emitting elements is transmitting out along the second direction.

The methods described herein control display substrate described herein, and the display apparatus having the display substrate described herein to perform two-dimensional image display, three-dimensional image display, and two-side display, which allows the display substrate to have multiple display function, and also allows the display apparatus to have multiple display function.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
    a first chromogenic layer;
    a plurality of first columns of light emitting elements on the first chromogenic layer;
    a second chromogenic layer on a side of the plurality of first columns of light emitting elements away from the first chromogenic layer; and
    a plurality of second columns of light emitting elements on a side of the second chromogenic layer away from the first chromogenic layer;
    wherein the plurality of first columns of light emitting elements are arranged along substantially a same direction as the plurality of second columns of light emitting elements;
    the plurality of second columns of light emitting elements are spaced apart by a plurality of inter-column gap regions respectively; and
    a respective one of the plurality of first columns of light emitting elements is at least partially in a respective one of the plurality of inter-column gap regions;
    wherein an orthographic projection of a respective one the plurality of first columns of light emitting elements on the first chromogenic layer is at least partially non-overlapping with an orthographic projection of the plurality of second columns of light emitting elements on the first chromogenic layer; and
    an orthographic projection of a respective one the plurality of second columns of light emitting elements on the first chromogenic layer is at least partially non-overlapping with an orthographic projection of the plurality of first columns of light emitting elements on the first chromogenic layer.

2. The display substrate of claim 1, wherein the second chromogenic layer occupies at least the plurality of inter-column gap regions.

3. A display substrate, comprising:
    a first chromogenic layer;
    a plurality of first columns of light emitting elements on the first chromogenic layer;
    a second chromogenic layer on a side of the plurality of first columns of light emitting elements away from the first chromogenic layer; and
    a plurality of second columns of light emitting elements on a side of the second chromogenic layer away from the first chromogenic layer;

wherein the plurality of first columns of light emitting elements are arranged along substantially a same direction as the plurality of second columns of light emitting elements;

the plurality of second columns of light emitting elements are spaced apart by a plurality of inter-column gap regions respectively; and a respective one of the plurality of first columns of light emitting elements is at least partially in a respective one of the plurality of inter-column gap regions;

wherein the second chromogenic layer occupies at least the plurality of inter-column gap regions;

an orthographic projection of the first chromogenic layer on a base substrate substantially covers an orthographic projection of the plurality of first columns of light emitting elements on the base substrate; and an orthographic projection of the second chromogenic layer on the base substrate substantially covers an orthographic projection of the plurality of first columns of light emitting elements on the base substrate.

4. The display substrate of claim 1, wherein the plurality of first columns of light emitting elements are a plurality of dual emitting light emitting elements and configured to emit light along a first direction from the plurality of first columns of light emitting elements to the second chromogenic layer and along a second direction from the plurality of first columns of light emitting elements to the first chromogenic layer; and the plurality of second columns of light emitting elements are a plurality of top emitting light emitting elements and configured to emit light along the first direction.

5. The display substrate of claim 1, wherein, when the display substrate is configured to be operated in a three-dimensional image display mode, the plurality of second columns of light emitting elements are turned off;

the plurality of first columns of light emitting elements are turned on and configured to emit light;

the second chromogenic layer is configured to be in a light transmitting state and configured to allow light emitted from the plurality of first columns of light emitting elements along the first direction to transmit through the second chromogenic layer and the plurality of inter-column gap regions; and the first chromogenic layer is configured to be in a light blocking state configured to block light emitted from the plurality of first columns of light emitting elements along the second direction from transmitting through the first chromogenic layer.

6. The display substrate of claim 1, wherein, when the display substrate is configured to be operated in a two-dimensional image display mode, the plurality of first columns of light emitting elements and the plurality of second columns of light emitting elements are both turned on and configured to emit light;

the second chromogenic layer is configured to be in a light transmitting state configured to allow light emitted from the plurality of first columns of light emitting elements along the first direction to transmit through the second chromogenic layer and the plurality of inter-column gap regions; and the first chromogenic layer is configured to be in a light blocking state configured to block light emitted from the plurality of first columns of light emitting elements along the second direction from transmitting through the first chromogenic layer.

7. The display substrate of claim 1, wherein, when the display substrate is configured to be operated in a two-side display mode, the plurality of first columns of light emitting elements and the plurality of second columns of light emitting elements are both turned on and configured to emit light;

the second chromogenic layer is configured to be in a light blocking state configured to block light emitted from the plurality of first columns of light emitting elements along the first direction from transmitting through the second chromogenic layer; and the first chromogenic layer is configured to be in a light transmitting state configured to allow light emitted from the plurality of first columns of light emitting elements along the second direction to transmit through the first chromogenic layer.

8. The display substrate of claim 1, wherein at least one of the first chromogenic layer or the second chromogenic layer is an integral unitary layer extending substantially throughout the display substrate.

9. The display substrate of claim 1, wherein the second chromogenic layer comprises a plurality of second chromogenic bars respectively in the plurality of inter-column gap regions;

the first chromogenic layer comprises a plurality of first chromogenic bars; and an orthographic projection of a respective one of the plurality of first chromogenic bars on a base substrate substantially covers an orthographic projection of a respective one the plurality of first columns of light emitting elements on the base substrate.

10. The display substrate of claim 1, further comprising a first controller configured to control the first chromogenic layer to reversibly transition between a light transmitting state and a light blocking state; and a second controller configured to control the second chromogenic layer to reversibly transition between the light transmitting state and the light blocking state.

11. The display substrate of claim 8, wherein first chromogenic layer and the second chromogenic layer are two different photochromic layers selected from a group consisting of an infrared light photochromic layer and an ultraviolent light photochromic layer;

the first controller is a first substantially transparent layer configured to control light transmitting state of the first chromogenic layer by transmitting infrared light or ultraviolent light to the first chromogenic layer; and the second controller is a second substantially transparent layer configured to control light transmitting state of the second chromogenic layer by transmitting infrared light or ultraviolent light to the second chromogenic layer.

12. A display substrate, comprising:

a first chromogenic layer;

a plurality of first columns of light emitting elements on the first chromogenic layer;

a second chromogenic layer on a side of the plurality of first columns of light emitting elements away from the first chromogenic layer; and a plurality of second columns of light emitting elements on a side of the second chromogenic layer away from the first chromogenic layer;

wherein the plurality of first columns of light emitting elements are arranged along substantially a same direction as the plurality of second columns of light emitting elements;

the plurality of second columns of light emitting elements are spaced apart by a plurality of inter-column gap regions respectively; and a respective one of the plurality of first columns of light emitting elements is at least partially in a respective one of the plurality of inter-column gap regions;

wherein a respective one of the plurality of first columns of light emitting elements comprises a plurality of rows of first light emitting elements;

a respective one of the plurality of rows of first light emitting elements comprises a plurality of first subpixels;

a respective one of the plurality of second columns of light emitting elements comprises a plurality of rows of second light emitting elements; and a respective one of the plurality of rows of second light emitting elements comprises a plurality of second subpixels.

13. A display apparatus, comprising:

the display substrate of claim 1; and one or more integrated circuits connected to the display substrate.

14. The display apparatus of claim 13, further comprising an infrared light source and an ultraviolent light source respectively connected with the first chromogenic layer and the second chromogenic layer.

\* \* \* \* \*